(12) United States Patent
Makihata et al.

(10) Patent No.: US 9,478,503 B2
(45) Date of Patent: Oct. 25, 2016

(54) INTEGRATED DEVICE

(71) Applicants: Mitsutoshi Makihata, Sendai (JP); Masayoshi Esashi, Sendai (JP); Shuji Tanaka, Sendai (JP); Masanori Muroyama, Sendai (JP); Hirofumi Funabashi, Nagoya (JP); Yutaka Nonomura, Nagoya (JP); Yoshiyuki Hata, Nagoya (JP); Hitoshi Yamada, Aichi-gun (JP); Takahiro Nakayama, Nagoya (JP); Ui Yamaguchi, Toyota (JP)

(72) Inventors: Mitsutoshi Makihata, Sendai (JP); Masayoshi Esashi, Sendai (JP); Shuji Tanaka, Sendai (JP); Masanori Muroyama, Sendai (JP); Hirofumi Funabashi, Nagoya (JP); Yutaka Nonomura, Nagoya (JP); Yoshiyuki Hata, Nagoya (JP); Hitoshi Yamada, Aichi-gun (JP); Takahiro Nakayama, Nagoya (JP); Ui Yamaguchi, Toyota (JP)

(73) Assignees: TOHOKU UNIVERSITY, Sendai-Shi (JP); KABUSHIKI KAISHA TOYOTA CHUO-KENKYUSHO, Nagakute-Shi (JP); TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/389,103

(22) PCT Filed: Feb. 28, 2013

(86) PCT No.: PCT/JP2013/001218
§ 371 (c)(1),
(2) Date: Sep. 29, 2014

(87) PCT Pub. No.: WO2013/145555
PCT Pub. Date: Oct. 3, 2013

(65) Prior Publication Data
US 2015/0333046 A1    Nov. 19, 2015

(30) Foreign Application Priority Data

Mar. 30, 2012  (JP) .................. 2012-079811

(51) Int. Cl.
*H01L 23/552* (2006.01)
*H01L 23/538* (2006.01)
(Continued)

(52) U.S. Cl.
CPC ............ *H01L 23/552* (2013.01); *B81B 7/008* (2013.01); *B81C 1/00238* (2013.01);
(Continued)

(58) Field of Classification Search
None
See application file for complete search history.

(56) References Cited

U.S. PATENT DOCUMENTS

| 5,455,455 A | 10/1995 | Badehi |
| 2001/0018236 A1 | 8/2001 | Badehi |

(Continued)

FOREIGN PATENT DOCUMENTS

| JP | H08-503813 A | 4/1996 |
| JP | 2002-512436 A | 4/2002 |

(Continued)

OTHER PUBLICATIONS

Avner Badihi, "Ultrathin wafer level chip size packaging," IEEE Transaction on Advanced Packaging, vol. 23, No. 2, May 2000, pp. 212-214.

(Continued)

*Primary Examiner* — Michelle Mandala
(74) *Attorney, Agent, or Firm* — Kenyon & Kenyon LLP

(57) ABSTRACT

An integrated device with high insulation tolerance is provided. A groove having an inclined side surface is provided between adjacent devices. When a side where an electronic circuit or MEMS device is mounted is a front surface, the groove becomes narrower from the front surface to a back surface because of the inclined surface. A mold material (insulating material) is disposed inside the groove, so that the plurality of devices are mechanically joined together, being electrically insulated from one another. A line member that establishes an electrical conduction between the adjacent devices is formed to lie along the side surface and the bottom surface of the groove. To lead the line out to the backside, the bottom surface of the groove has a hole, so that the line member is exposed to the backside from the hole.

18 Claims, 31 Drawing Sheets

(51) Int. Cl.
  *B81B 7/00* (2006.01)
  *H01L 21/78* (2006.01)
  *H01L 21/683* (2006.01)
  *H01L 21/306* (2006.01)
  *H01L 25/18* (2006.01)
  *H01L 27/06* (2006.01)
  *H01L 25/07* (2006.01)
  *H01L 25/16* (2006.01)
  *B81C 1/00* (2006.01)
  *H01L 25/00* (2006.01)
  *H01L 29/06* (2006.01)

(52) U.S. Cl.
  CPC .... *H01L 21/30625* (2013.01); *H01L 21/6835* (2013.01); *H01L 21/6836* (2013.01); *H01L 21/78* (2013.01); *H01L 23/5386* (2013.01); *H01L 25/072* (2013.01); *H01L 25/16* (2013.01); *H01L 25/18* (2013.01); *H01L 27/0611* (2013.01); *B81C 2203/0792* (2013.01); *H01L 25/50* (2013.01); *H01L 29/0657* (2013.01); *H01L 2221/68327* (2013.01); *H01L 2924/0002* (2013.01)

(56) References Cited

U.S. PATENT DOCUMENTS

| | | |
|---|---|---|
| 2002/0079804 A1 | 6/2002 | Benigni et al. |
| 2003/0080398 A1 | 5/2003 | Badehi |
| 2007/0273018 A1 | 11/2007 | Onozuka et al. |
| 2009/0039528 A1* | 2/2009 | Haba .................. H01L 21/6835 257/777 |
| 2012/0199921 A1 | 8/2012 | Tanaka et al. |
| 2012/0261179 A1 | 10/2012 | Yamamoto et al. |

FOREIGN PATENT DOCUMENTS

| | | |
|---|---|---|
| JP | 2003-124431 A | 4/2003 |
| JP | 2003-516634 A | 5/2003 |
| JP | 2004-516634 A | 6/2004 |
| JP | 2004-534375 A | 11/2004 |
| JP | 3621093 B2 | 2/2005 |
| JP | 2006-208248 A | 8/2006 |
| JP | 2007-260866 A | 10/2007 |
| JP | 2008-281403 A | 11/2008 |
| JP | 2011-066449 A | 3/2011 |
| JP | 2011-134982 A | 7/2011 |
| JP | 5328924 B2 | 10/2013 |
| KR | 2012-0091202 A | 8/2012 |
| KR | 10-1347768 B1 | 1/2014 |
| WO | 94/07267 A1 | 3/1994 |
| WO | 99/40624 A1 | 8/1999 |
| WO | 01/43181 A1 | 6/2001 |
| WO | 02/51217 | 6/2002 |

OTHER PUBLICATIONS

M. Makihata, et al., "Integration and packaging technology of MEMS-ON-CMOS tactile sensor for robot application using molded thick BCB layer and backside-grooved electrical connection," Tranducers'11, Beijing, China, Jun. 5-9, 2011, pp. 815-818.

M. Makihata, et al., "A 1.7MM3 MEMS-ON-CMOS tactile sensor using human-inspired autonomous common bus communication," Tranducers 2013, Barcelona, Spain, Jun. 16-20, 2013, pp. 2729-2732.

M. Makihata, et al., "MEMS-CMOS Integrated tactile sensor with digital signal processing for robot application" 2012 MRS spring meeting, Aug. 27, 2012, 8 pages.

* cited by examiner

INTEGRATED DEVICE

CROSS-REFERENCE TO RELATED APPLICATIONS

This is a national phase application based on the PCT International Patent Application No. PCT/JP2013/001218 filed Feb. 28, 2013, claiming priority to Japanese Patent Application No. 2012-079811 filed Mar. 30, 2012, the entire contents of both of which are incorporated herein by reference.

TECHNICAL FIELD

The present invention relates to an integrated device.

BACKGROUND ART

An integrated device where a plurality of devices are integrated together is used. An example of a well-known integrated device is a semiconductor integrated circuit. With the development of MEMS technology, devices with high power consumption are integrally mounted on a semiconductor chip in many cases today. Accordingly, a plurality of devices that consume high power are integrated into one semiconductor device.

CITATION LIST

Patent Literature

[PTL 1] Japanese Unexamined Patent Application Publication No. 2008-281403
[PTL 2] Japanese Unexamined Patent Application Publication No. 2006-208248

SUMMARY OF INVENTION

Technical Problem

For example, in the case where MEMS, power MOS transistor integrated circuit and IGBT are integrated into one semiconductor device, they need to be electrically insulated from one another. However, in the case of dielectric isolation which is typically formed on a semiconductor substrate the insulation voltage is insufficiently low for the electrical insulation in the semiconductor device. This causes the occurrence of dielectric coupling, which can lead to crosstalk and the like.

Solution to Problem

An integrated device according to the present invention is made up of a plurality of different types of devices separated from one another and mechanically joined together, wherein a groove having a side surface containing an inclined surface is formed between the adjacent devices, when a front surface is in a side of the integrated device where a functional element is mounted, the inclined surface makes the groove to become narrower along the direction from the front surface to a back surface of the integrated device, an insulating material is disposed at the groove, and adapted for that the plurality of devices are mechanically joined together, while being electrically insulated from one another.

In this invention, it is preferred that the insulating material disposed at the groove is a mold material.

In this invention, it is preferred that the insulating material forms a bottom surface of the groove.

In this invention, it is preferred that the insulating material forms the side surface and the bottom surface of the groove.

In this invention, it is preferred that the groove is filled with the insulating material.

In this invention, it is preferred that the insulating material is formed to continuously cover surfaces of the plurality of devices and inside of the groove.

In this invention, it is preferred that the insulating material is made from as same ingredient as an insulating film formed on a surface of the device and continuous with the insulating film.

In this invention, it is preferred that a line member is located to extends inside the groove to establish an electrical conduction between the adjacent devices, and
the line member is formed besides the side surface of the groove and the bottom surface of the groove.

In this invention, it is preferred that an insulating film is interposed between the line member and the device adapted to electrically insulate the line member and the device from each other.

In this invention, it is preferred that a hole is formed at the bottom surface of the groove, and the line member is exposed toward the back surface through the hole.

In this invention, it is preferred that the groove is filled with the insulating material, and
the line member is protected by the insulating material filled inside the groove.

In this invention, it is preferred that a surface of the insulating material filled inside the groove is planarized, and a line for establishing an electrical conduction between the adjacent devices is formed across the groove on the planarized surface.

In this invention, it is preferred that the functional element is an electronic circuit or a MEMS device.

In this invention, it is preferred that the functional element is a high power drive device.

In this invention, it is preferred that the device is formed on any one of a silicon semiconductor substrate, a compound semiconductor substrate, a thin metal plate substrate, a glass substrate, a ceramic substrate, a printed substrate and a resin substrate.

A manufacturing method for an integrated device according to the present invention is a manufacturing method for manufacturing the above-described integrated device, which includes a step of forming a groove having a side surface containing an inclined surface from a surface of the substrate wherein a depth of the groove does not penetrate the substrate, a step of burying at least a bottom surface of the groove under an insulating material, and
a step of polishing a back surface of the substrate for thinning to separate adjacent devices from one another, adapted for that the plurality of devices are mechanically joined together while being electrically insulated from one another with the insulating material forming at least a part of the groove.

A manufacturing method for an integrated device according to the present invention is a manufacturing method for manufacturing the above-described integrated device, which includes a step of attaching a support film onto a back surface of a substrate, a step of forming a groove from a front surface of the substrate wherein the groove has a depth that the groove penetrates the substrate but does not penetrate the support film, a step of burying at least a bottom surface of the groove under an insulating material, and
a step of separating the support film.

In this invention, it is preferred that the insulating material is a mold material.

DESCRIPTION OF EMBODIMENTS

Figure 1:
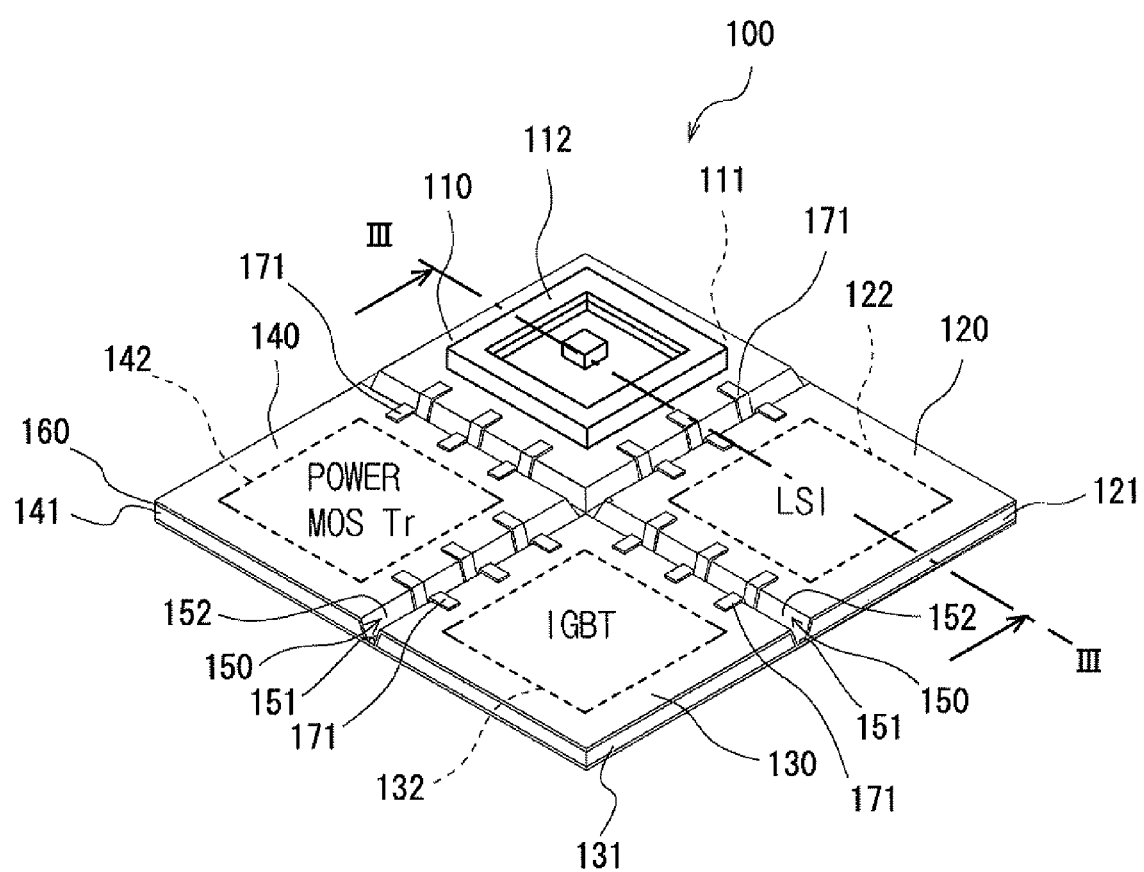
FIG. 1 is a perspective view showing the front surface of a semiconductor device.

Embodiments of the present invention are illustrated in drawings and described with reference to the reference numerals assigned to elements in the drawings.

Note that, in cross-sectional views often referred to in the description, hatching is omitted for clarity of the drawings since hatching narrow areas can hinder the clarity of the drawings. Omitting the hatching would not prevent one skilled in the art understanding the drawings.

(First Embodiment)

FIG. 1 is a perspective view showing the front surface of a semiconductor device.

Figure 2:
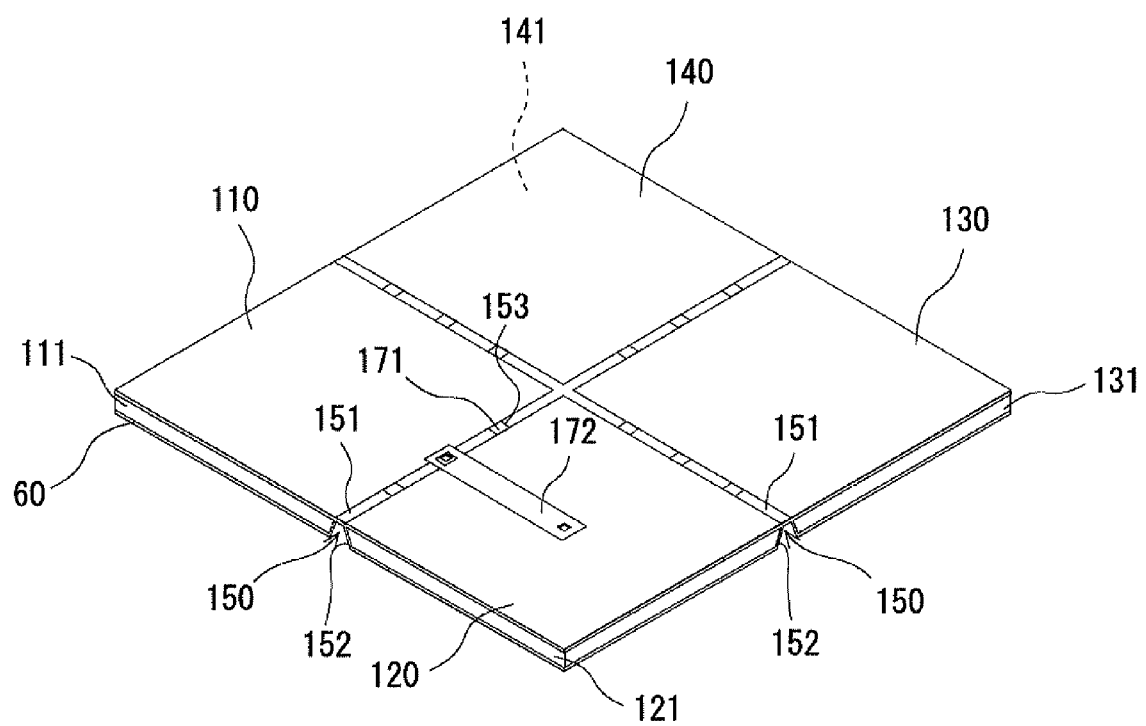
FIG. 2 is a perspective view showing the back surface of the semiconductor device.

FIG. 2 is a perspective view showing the back surface of the semiconductor device.

Figure 3:
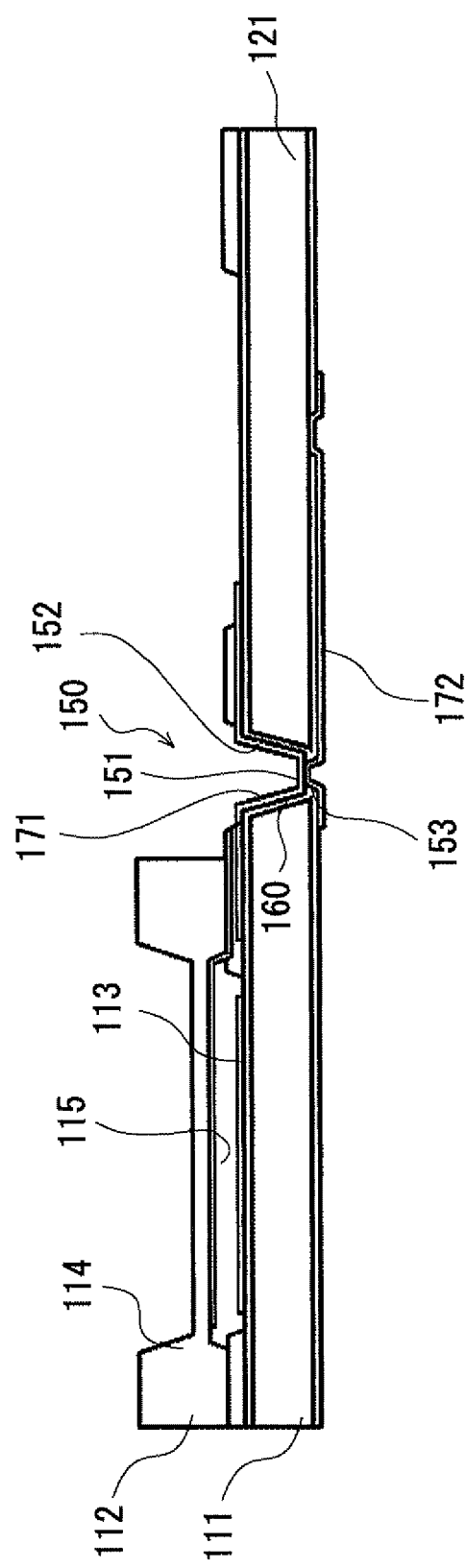
FIG. 3 is a cross-sectional view along line III-III in FIG. 1.

FIG. 3 is a cross-sectional view along line III-III in FIG. 1.

As is obvious from FIG. 1, a semiconductor device (integrated device) 100 according to a first embodiment is made of a plurality of device regions 110, 120, 130 and 140 joined together. In this example, one semiconductor device is composed of the four device regions 110, 120, 130 and 140. In FIG. 1, the four device regions are referred to as a first semiconductor device region 110, a second semiconductor device region 120, a third semiconductor device region 130 and a fourth semiconductor device region 140, clockwise from the far left.

In the first semiconductor device region 110, a pressure sensor 112, which is MEMS (Micro Electro Mechanical Systems), is attached onto its top face. In the second semiconductor device region 120 to the fourth semiconductor device region 140, semiconductor integrated circuits are built respectively. Those semiconductor integrated circuits are a noise reduction filter circuit, a drive circuit, a logical operation circuit and the like, for example. In this example, an LSI (Large Scale Integration) 122 is built into the second semiconductor device region 120. A power control switch circuit, for example, including IGBT (Insulated Gate Bipolar Transistor) 132, is built into the third semiconductor device region 130. A drive circuit, for example, including a power MOSFET 142, is built into the fourth semiconductor device region 140.

The structure of this embodiment is described hereinafter with reference to FIGS. 1 to 3.

In this embodiment, the plurality of semiconductor device regions 110 to 140 are mechanically joined together. They are joined by a bottom surface 151 of a groove 150 as shown in FIG. 1 or 3 in a joint part.

For description, a semiconductor substrate in the first semiconductor device region 110 is referred to as a first semiconductor substrate 111, a semiconductor substrate in the second semiconductor device region 120 is referred to as a second semiconductor substrate 121, a semiconductor substrate in the third semiconductor device region 130 is referred to as a third semiconductor substrate 131, and a semiconductor substrate in the fourth semiconductor device region 140 is referred to as a fourth semiconductor substrate 141.

As shown in FIG. 1 or 3, the semiconductor substrates are fragmented from one another, and they are completely separate pieces. In other words, the first semiconductor substrate 111, the second semiconductor substrate 121, the third semiconductor substrate 131 and the fourth semiconductor substrate 141 are not combined as one substrate and separated from one another. Because the semiconductor substrates 111 to 141 are separated from one another, a groove 150 is formed between the semiconductor device regions 110 to 140. In the groove 150, a side surface 152 is an inclined surface so that it becomes narrower from the front side to the back side. Note that, although the side surface 152 of the groove 150 is a flat surface in FIG. 3, it may be a curved surface, not a flat surface, as long as it is an inclined surface.

A mold material 160 forms at least a part of the groove 150. By the mold material 160 forming at least a part of the groove 150, the semiconductor substrates 111 to 141 are mechanically joined together. In the first embodiment, the mold material 160 serves also as an insulating film, and covers the surfaces of the first to fourth semiconductor substrates 111 to 141 and forms the bottom surface and the inclined surface of the groove.

Further, a line member 171 as a rewiring layer is provided extending on the inclined surface 152 and the bottom surface 151 of the groove 150 to electrically connect the adjacent semiconductor device regions 110 to 140. In this example, the line member 171 is formed on the front side of the insulating film (mold material) 160. In this manner, a plurality of semiconductor device regions are mechanically joined together and electrically connected to one another, though their substrates are not combined together.

Further, as shown in FIGS. 2 and 3, a part of the mold material (insulating film) 160 that forms the bottom surface 151 of the groove 150 has an opening on the back side, and the line member 171 is exposed to the backside at an opening 153. The line member 171 exposed to the backside is used as a back contact and connected to a backside line 172.

A manufacturing method of the first embodiment having the above structure is described hereinbelow.

The description is provided by reference to FIGS. 4 to 12.

Figure 4A:
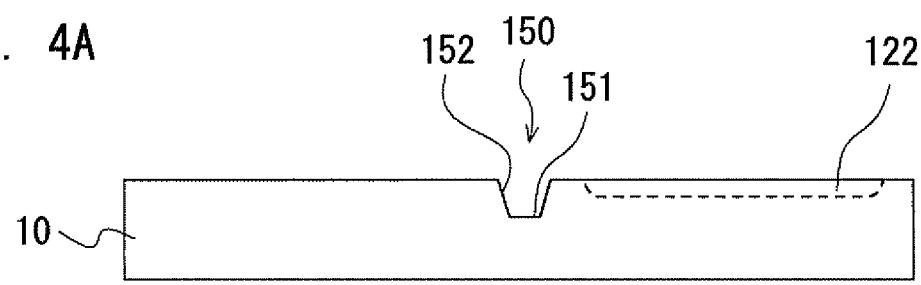
FIG. 4A is a view to provide an explanation of a manufacturing method according to a first embodiment.

First, one semiconductor wafer 10 is prepared, and a circuit such as the LSI (122) is built into a predetermined position. Next, the groove 150 is cut into the surface of the semiconductor wafer 10 by a rotating blade or the like as shown in FIG. 4A. As the rotating blade, the Z09 blade from DISCO Corporation may be used, for example. At this point, the groove 150 does not need to separate the wafer 10 and it may be a cut with a predetermined depth.

The side surface 152 of the groove 150 is made inclined in this step. The side surface 152 of the groove 150 can be made inclined by using the rotating blade with a tapered angle, for example. A rotating blade with a taper angle of 55° is used as one example.

Figure 4B:
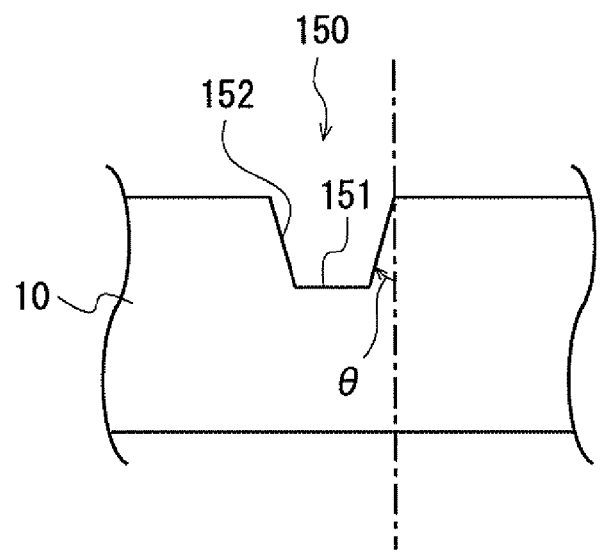
FIG. 4B is a view to provide an explanation of the manufacturing method according to the first embodiment.

When it is assumed that angle of inclination of a surface perpendicular to the wafer surface is 0°, the angle of inclination θ of the inclined surface is larger than 0° and smaller than 90° as shown in FIG. 4B. Although the angle of inclination θ ranges larger than 0° to smaller than 90°, it is preferably in the range from 5° to 85°, and most preferably from 30° to 60°. A preferred value for the angle of inclination θ is determined in consideration of the size of the semiconductor device 100 and the easiness of processing inside the groove. If the angle of inclination θ is too large, the area of the groove 150 becomes too large, which leads to an increase in the size of the semiconductor device 100. If the angle of inclination θ is too small, processing inside the groove becomes difficult. For example, the small angle of inclination θ can lead to failure to form an insulating film, place the mold material, and form the line member 171 inside the groove. A preferred angle of inclination θ is designed in view of the above matters.

Figure 5:
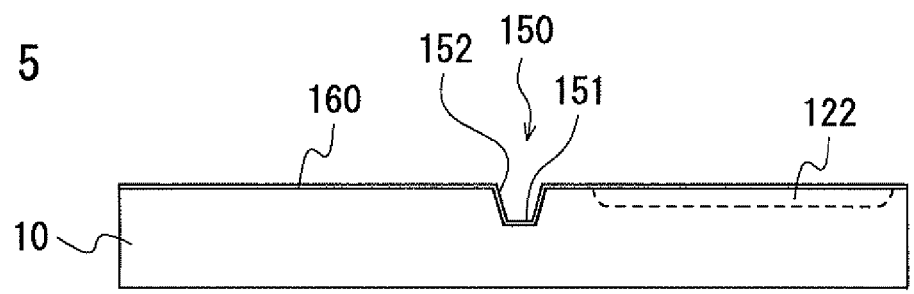
FIG. 5 is a view to provide an explanation of the manufacturing method according to the first embodiment.

Next, the insulating film 160 is formed on the surface as shown in FIG. 5.

As the insulating film 160, various types of inorganic and organic insulating films can be used, including $SiO_2$, TEOS $(Si(OC_2H_5)4$; Tetraethyl orthosilicate) and BCB (Benzocyclobutene).

Figure 6:
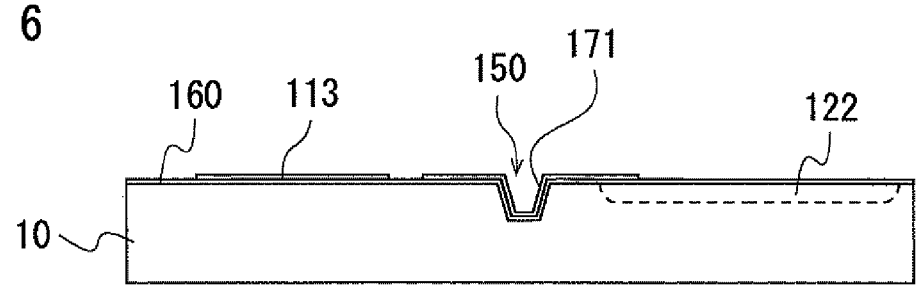
FIG. 6 is a view to provide an explanation of the manufacturing method according to the first embodiment.

Then, in FIG. 6, the line member 171 that lies inside the groove 150 is formed.

The line 171 is formed to lie along the inclined surface 152 and the bottom surface 151 of the groove 150 and electrically connect the adjacent semiconductor device regions 110 to 140. The line 171 is formed by depositing a metal material such as Au (gold) or Al (aluminum).

At the same time, a lower electrode 113 is formed in the region to become the first semiconductor device region 110 in consideration of the MEMS sensor 112 to be mounted later.

Figure 7:
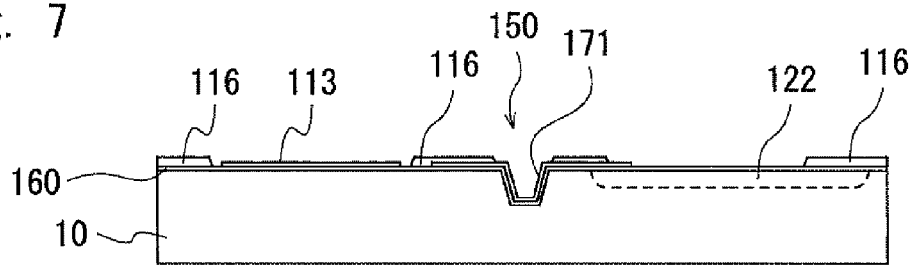
FIG. 7 is a view to provide an explanation of the manufacturing method according to the first embodiment.

Then, in FIG. 7, a bonding layer 116 is formed. The bonding layer 116 is used to attach a diaphragm unit 114, which is the upper structure of the MEMS pressure sensor 112, onto the front surface of the first semiconductor device region 110. The bonding layer 116 may be BCB (Benzocyclobutene).

Figure 8:
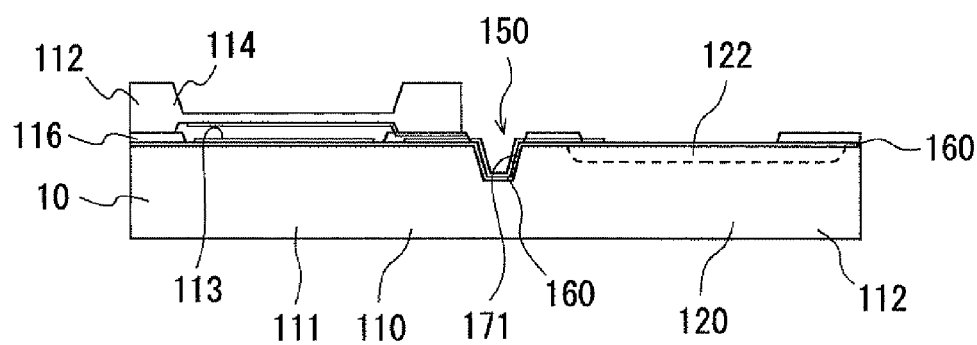
FIG. 8 is a view to provide an explanation of the manufacturing method according to the first embodiment.

Then, as shown in FIG. 8, the diaphragm unit 114 of the MEMS pressure sensor 112 is attached onto the front surface of the first semiconductor device region 110. Note that, as shown in FIG. 8, the diaphragm unit 114 is processed into a predetermined shape by etching or the like, and an electrode 115 is already provide on its backside.

Figure 9:
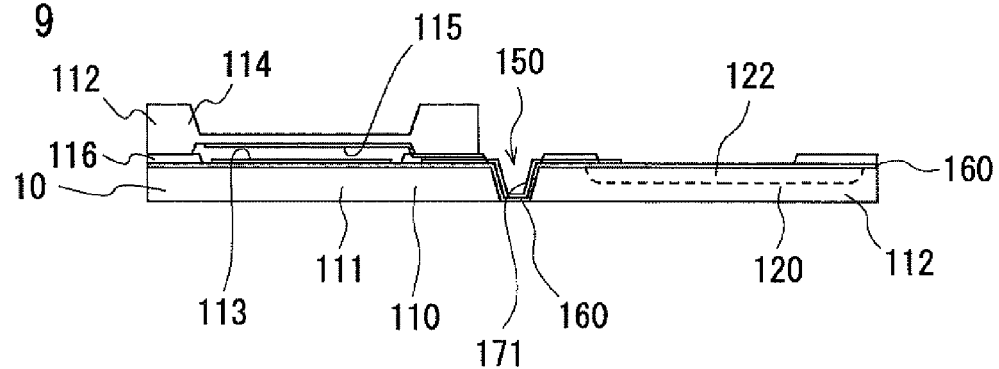
FIG. 9 is a view to provide an explanation of the manufacturing method according to the first embodiment.

Then, as shown in FIG. 9, the back surface of the wafer 10 is polished to make the wafer thinner. The polishing is performed to the extent that the mold material (insulating film) 160 at the bottom surface 151 of the groove 150 is exposed. As a result, the semiconductor device regions (110 and 120) are separated by the groove.

Figure 10:
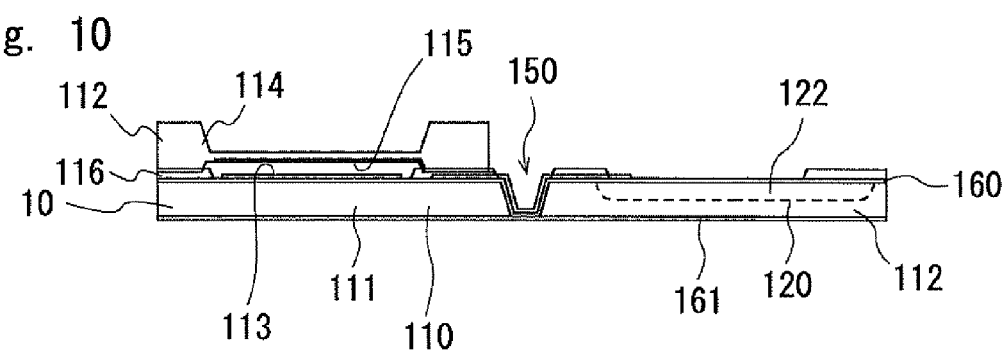
FIG. 10 is a view to provide an explanation of the manufacturing method according to the first embodiment.
Figure 11:
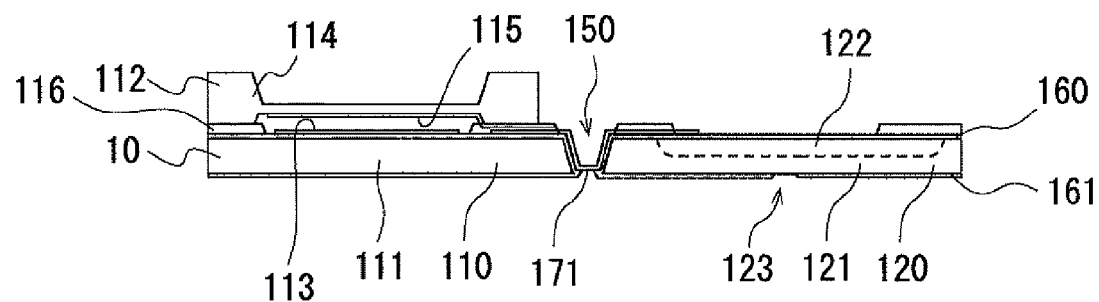
FIG. 11 is a view to provide an explanation of the manufacturing method according to the first embodiment.

Then, as shown in FIG. 10, an insulating film 161 is formed on the back surface. After that, the back surface is patterned as shown in FIG. 11. Specifically, the insulating film 161 and the mold material (insulating film) 160 at the bottom surface 151 of the groove 150 are partly removed from the backside, so that the metal line 171 in the groove 150 is exposed to the backside. At the same time, an opening 123 for establishing a back contact for the semiconductor device region (120) is formed as necessary.

Figure 12:
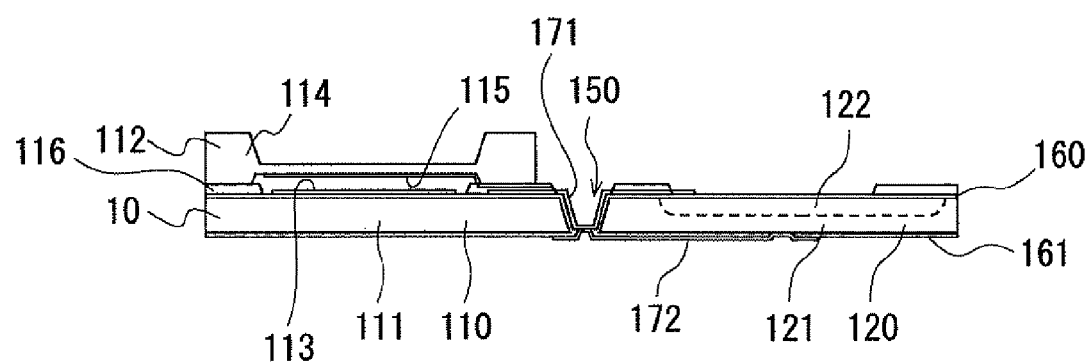
FIG. 12 is a view to provide an explanation of the manufacturing method according to the first embodiment.

Then, as shown in FIG. 12, a line 172 is formed on the back surface.

Finally, if needed, element isolation is performed. The semiconductor device 100 is thereby completed.

Figure 13:
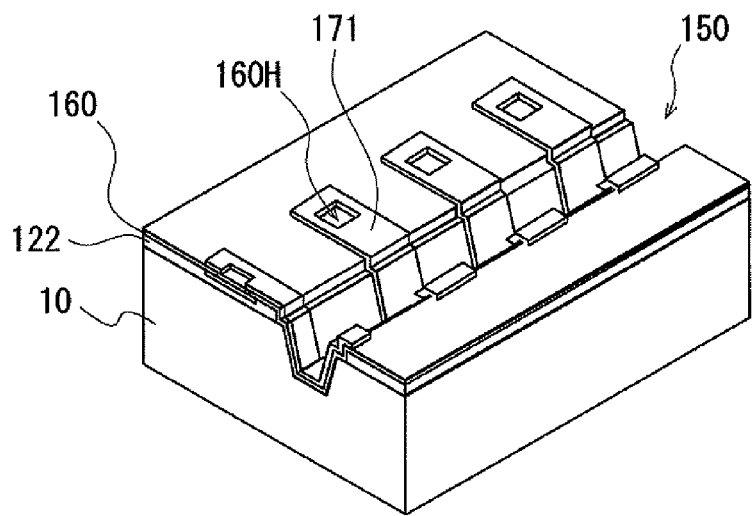
FIG. 13 is a view to provide a supplementary explanation of the manufacturing method according to the first embodiment.
Figure 14:
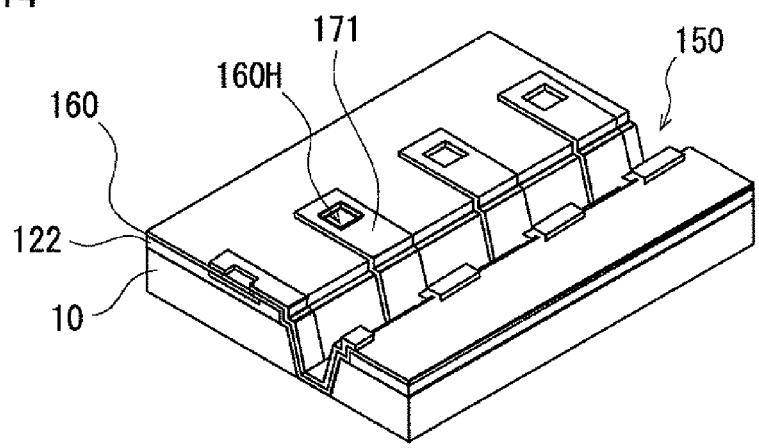
FIG. 14 is a view to provide a supplementary explanation of the manufacturing method according to the first embodiment.
Figure 15:
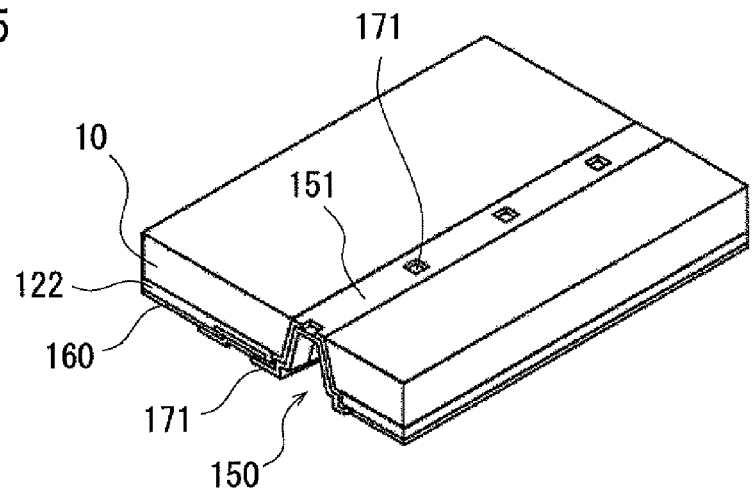
FIG. 15 is a view to provide a supplementary explanation of the manufacturing method according to the first embodiment.

Note that, although not described in the above example, in the case where it is necessary to electrically connect a circuit in the lower layer of the mold material (insulating film) 160 and the rewiring layer (line member) 171, it is are processed as follows. Specifically, between the step of FIG. 5 and the step of FIG. 6, an opening (contact hole) 160H is formed in the insulating film 160, and then the metal line 171 is deposited as shown in FIG. 13. After that, the wafer is thinned (FIG. 14) and the metal line is lead to the backside (FIG. 15).

The first embodiment has the following advantages.

(1) If semiconductor substrates are combined together as like as conventional one, it has been unable to integrate electronic elements requiring a withstand voltage of several hundred volts together.

In this embodiment, the semiconductor device regions 110 to 140 of the semiconductor device 100 are electrically isolated by the groove, while they are mechanically joined by the mold material (insulating film) 160 forming at least a part of the groove 150. The electrical insulation and the integration are thereby achieved at the same time. Further, if the line member 171 is formed on the mold material (insulating film) 160, the substrate 10 and the line member 171 can be easily insulated from each other. Thus, each semiconductor device region is completely electrically insulated from the adjacent device region, which allows significant reduction of cross-talk.

This enables the integration of elements that withstands voltage of several ten to several hundred volts. For example, as illustrated in the first embodiment, an integrated device where a functional element (MEMS sensor 112) requiring high power is integrated with drive control units (LSI, IGBT, power MOS transistor etc.) can be implemented.

This is an excellent technique that enables the integration of different types of devices, overcoming the restriction of the exist SIP (System In Package) or SOC (System On Chip).

(2) In this embodiment, because the side surface 152 of the groove 150 is an inclined surface, various processing can be done inside the groove. For example, if the side surface 152 of the groove 150 is perpendicular (i.e.)θ=0°, it is significantly difficult to deposit a metal line onto the side surface 152 of the groove 150. On the other hand, because the side surface 152 of the groove 150 is inclined, the line 171 can be formed easily and reliably by deposition. Likewise, the insulating film 160 can be also formed easily when the side surface 152 of the groove 150 is inclined.

(3) The structure of this embodiment is simple and easy to manufacture to make an electrical contact in the backside. The line 171 can be lead to the backside by forming the line 171 inside the groove 150 which has an inclined surface and thinning the wafer 10. Further, the step of processing the groove 150 is a step that is completely independent of building the LSI (122) and the like, which may be implemented before or after building the LSI. As a method of leading the line to the backside, the methods disclosed in Japanese Unexamined Patent Application Publication No. 2011-134982 and Japanese Unexamined Patent Application Publication No. 2011-66449 are also known. These methods form a fine through-hole in a semiconductor substrate during LSI fabrication and fill the fine through-hole with a conductive material. However, it takes time and it is highly difficult to form the fine through-hole during LSI fabrication.

It also takes time and is highly difficult to fill the fine through-hole with the conductive material. Further, it is extremely difficult to form an insulating film inside the fine through-hole in order to insulate the side surface of the through-hole and the conductive material. A sufficient withstand voltage cannot be obtained with such a thin film (several μm or less). Furthermore, there is a possibility that the conductive material placed inside the fine through-hole of the semiconductor substrate gives rise to corrosion.

On the other hand, the structure and the manufacturing method of this embodiment have advantages of being simple, easy and reliable.

(4) In this embodiment, a plurality of semiconductor device regions are joined into an integrated device not by bonding the finished semiconductor device regions together one by one. Specifically, in this embodiment, the leading of the line to the backside, the insulation and the joint are done during a series of steps for manufacturing the integrated device from one wafer. On the other hand, if the leading of the line to the backside, the insulation and the joint are performed as completely independent steps, the number of steps increases, and the joint strength decreases. According to the structure and the manufacturing method of this embodiment, it is possible to reduce the number of steps and increase the joint strength.

(5) In this embodiment, the metal line 171 to be lead to the backside is formed on the inclined surface and the bottom surface of the groove. Because the side surface of the groove is inclined, it is certain that the continuous metal line 17 can be formed with a simple process such as deposition, for example. This method is simpler and more reliable compared to the method of filling a fine through-hole with a conductive material, for example.

(6) In this embodiment, because the groove is encompassed by the two side surfaces, the line 171 formed inside the groove is protected. Another possible way to lead the line to the backside is to lead the line from the front side to the backside through the side surface of the semiconductor device region. However, if the line is exposed on the side surface of the semiconductor device region in this manner, the line is subject to damage.

On the other hand, the line formed in the groove inside the semiconductor device is highly durable.

(7) The metal line to be used as the line member 171 is formed on the insulating film (mold material). The semiconductor substrate and the line can be thereby electrically insulated from each other.

At the same time, the problem of compatibility between the semiconductor substrate and the metal line can be solved, and their close bonding can be maintained.

Note that, as a matter of course, the metal line 171 needs to be lead to the backside only at necessary positions, and not all of the metal lines 171 need to be exposed to the backside from the bottom surface of the groove. Further, if it is not necessary to lead the metal line 171 to the backside, the metal line 171 does not to need to be lead. In other words, the bottom surface of the groove may have no opening when viewed from the backside in FIG. 15.

If an electrical connection by the metal line 171 is needed only on the front surface, the back contact and the backside line are not required.

In this structure also, the effects of insulation tolerance mediated by the separation of the semiconductor substrates are highly significant.

(Second Embodiment)

A second embodiment is described hereinafter.

Although the structure of the second embodiment is basically the same as that of the first embodiment, an insulating material such as glass or resin is used as a support substrate.

This is described sequentially with reference to FIGS. 16 to 24.

Figure 16:
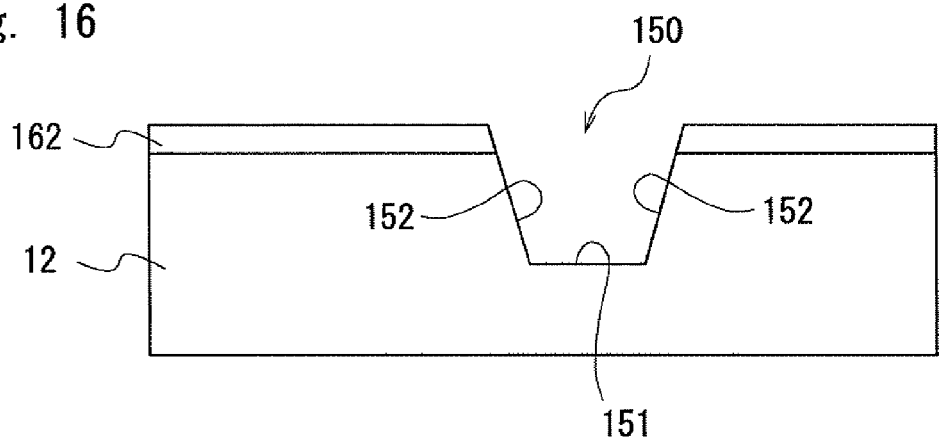
FIG. 16 is a view to provide an explanation of a second embodiment.

As the second embodiment, a substrate where a semiconductor layer 162 is placed on top of an insulating substrate 12 is used as shown in FIG. 16. The groove 150 is cut in the substrate 12. Accordingly, in this state, the inclined surface 152 and the bottom surface 151 of the groove 150 are the substrate 12.

Figure 17:
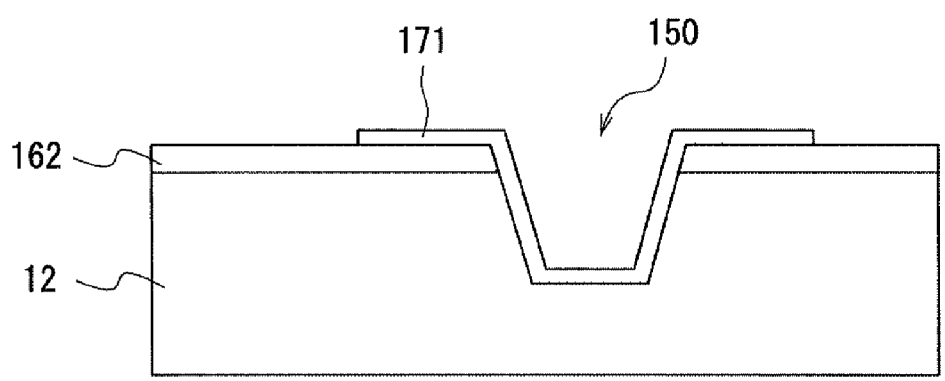
FIG. 17 is a view to provide an explanation of the second embodiment.
Figure 18:
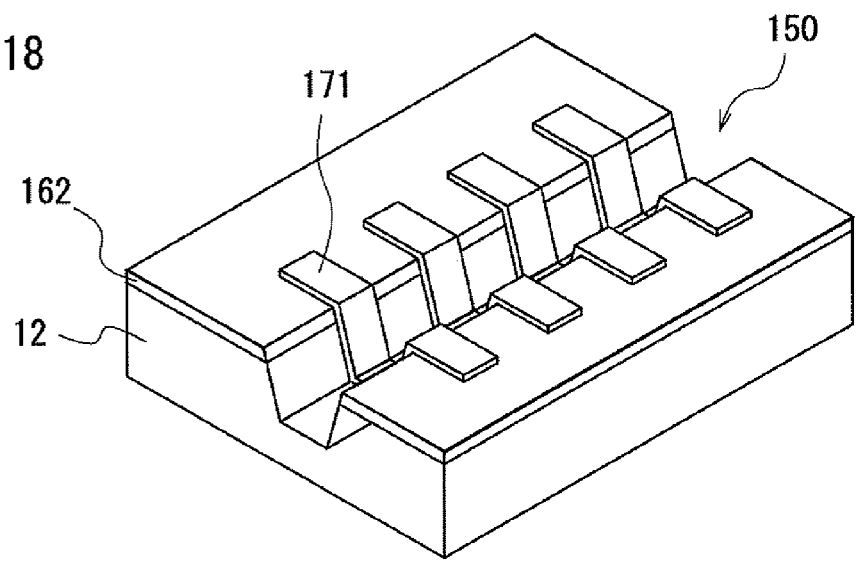
FIG. 18 is a view to provide an explanation of the second embodiment.

Next, the metal line 171 is formed in the groove 150 as shown in FIGS. 17 and 18.

In the above-described first embodiment, the metal line 171 is formed on the insulating film (160) inside the groove 150 as well. In the second embodiment, the metal line 171 is formed directly on the insulating substrate 12 inside the groove 150.

Figure 19:
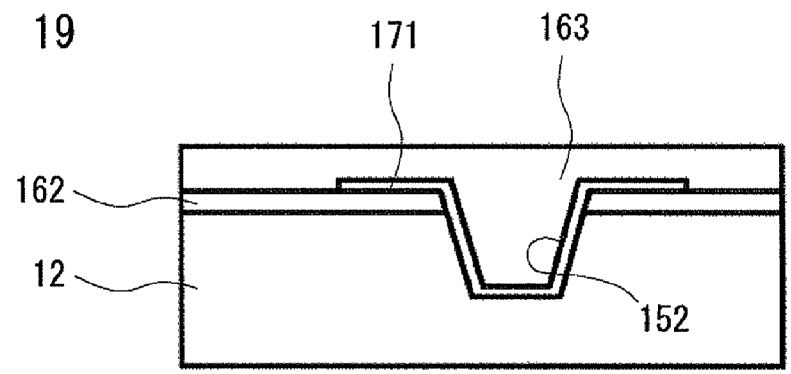
FIG. 19 is a view to provide an explanation of the second embodiment.
Figure 20:
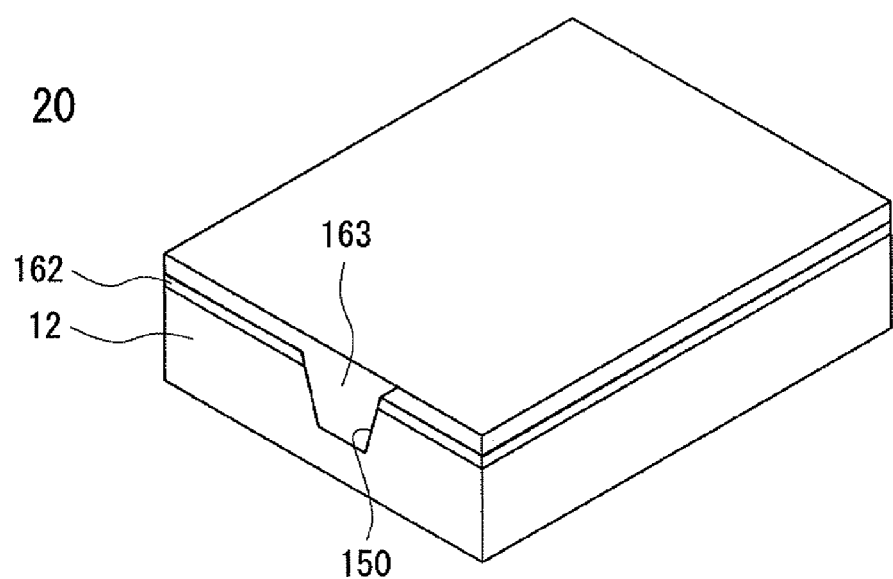
FIG. 20 is a view to provide an explanation of the second embodiment.

Then, a mold material 163 is formed on the surface and in the groove of the insulating substrate 12 as shown in FIGS. 19 and 20.

As the mold material 163, BCB (Benzocyclobutene), for example, may be applied by spin coating or the like. Further, the surface of the mold material is polished for planarization in consideration of the subsequent step.

Figure 21:
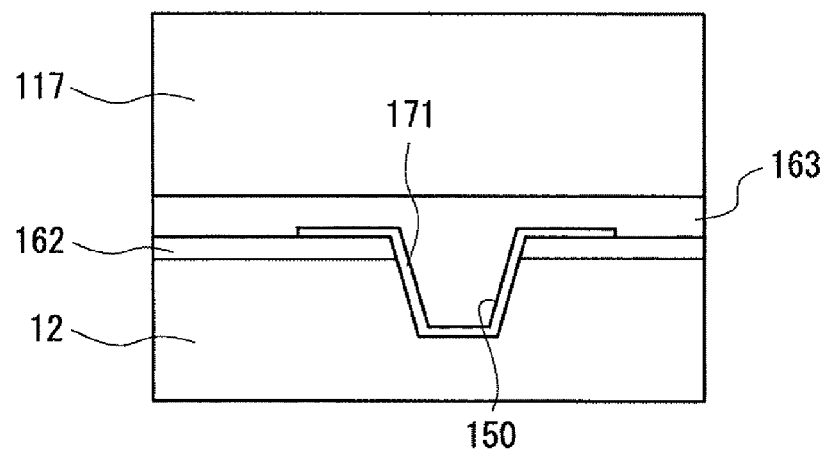
FIG. 21 is a view to provide an explanation of the second embodiment.

Then, a support substrate 117 for polishing the back surface is attached onto the surface of the insulating substrate 12 as shown in FIG. 21. At this time, the mold material (BCB in this example) 163 serves as a bonding material.

Figure 22:
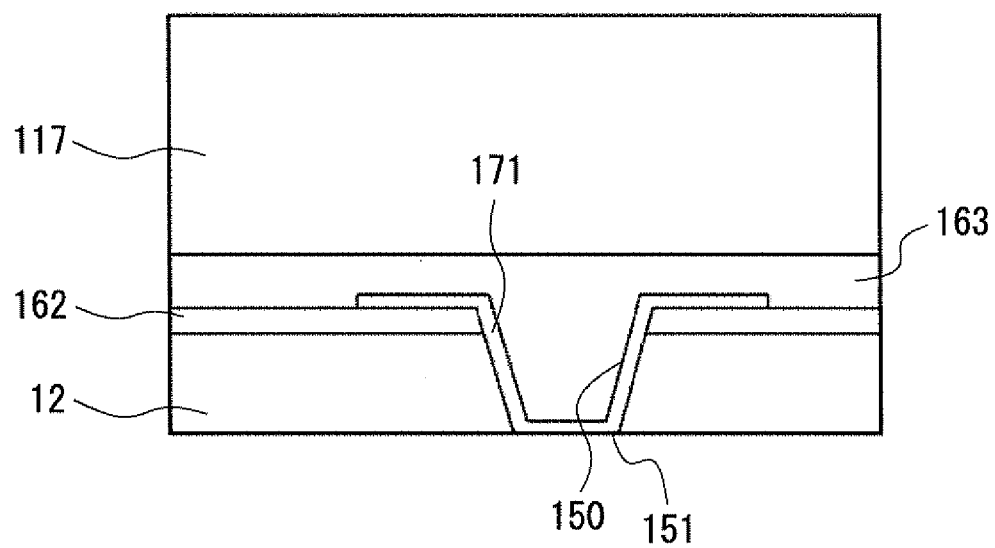
FIG. 22 is a view to provide an explanation of the second embodiment.
Figure 23:
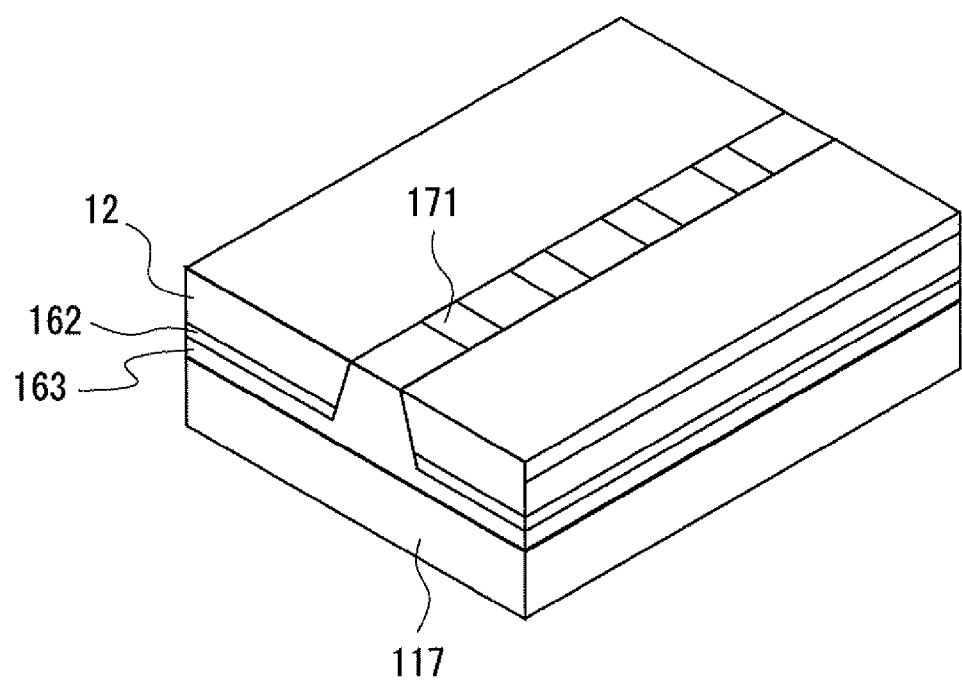
FIG. 23 is a view to provide an explanation of the second embodiment.

Then, the insulating substrate 12 is thinned as shown in FIGS. 22 and 23. Specifically, the metal line 171 is exposed to the backside through the bottom surface 151 of the groove 150 at the time when the thinning is done. Further, while the semiconductor device regions are separated from each other, the devices areas are strongly joined together because the groove 150 is filled with the mold material 163.

Figure 24:
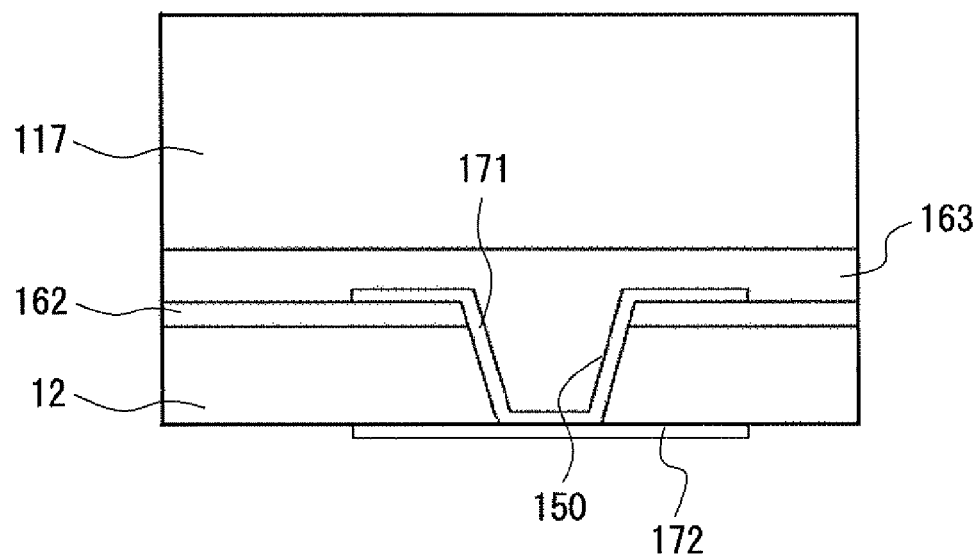
FIG. 24 is a view to provide an explanation of the second embodiment.

Then, a line 172 is formed on the back surface as shown in FIG. 24. Finally, the support substrate 117 is removed as necessary.

The second embodiment has the following advantages in addition to the advantages of the first embodiment described above.

(8) Because the groove 150 is filled with the mold material 163, the semiconductor device regions are strongly joined together. Further, because the groove 150 is filled with the mold material 163, the metal line 171 is protected. Furthermore, the strength of the integrated whole semiconductor device (integrated device) increases.

(9) In this embodiment, if the groove 150 is filled with the mold material 163 and further the surface is mechanically polished, it is possible to eliminate roughness from the surface and planarize the surface. For example, filling the groove with the mold material and then carrying out the mechanical polishing are easier compared to forming a fine through-hole, filling the hole and planarizing the surface.

(10) In the second embodiment also, it is significant that the side surface of the groove is inclined. For example, if the side surface of the groove is perpendicular, there is a possibility that the mold material cannot be placed into every corner of the groove when it is pushed into the groove. For example, if the groove is narrow, it is difficult in some cases to push the mold material into the square corner provided between the side surface and the bottom surface.

In this embodiment, on the other hand, because the side surface 152 of the groove 150 is inclined, it is certain that the mold material 163 can be filled into every corner of the groove. The joint between the adjacent device regions thereby becomes strong, thus improving the durability and reliability of the device.

(Third Embodiment)

As a third embodiment, a variation of providing a groove is described.

Figure 25:
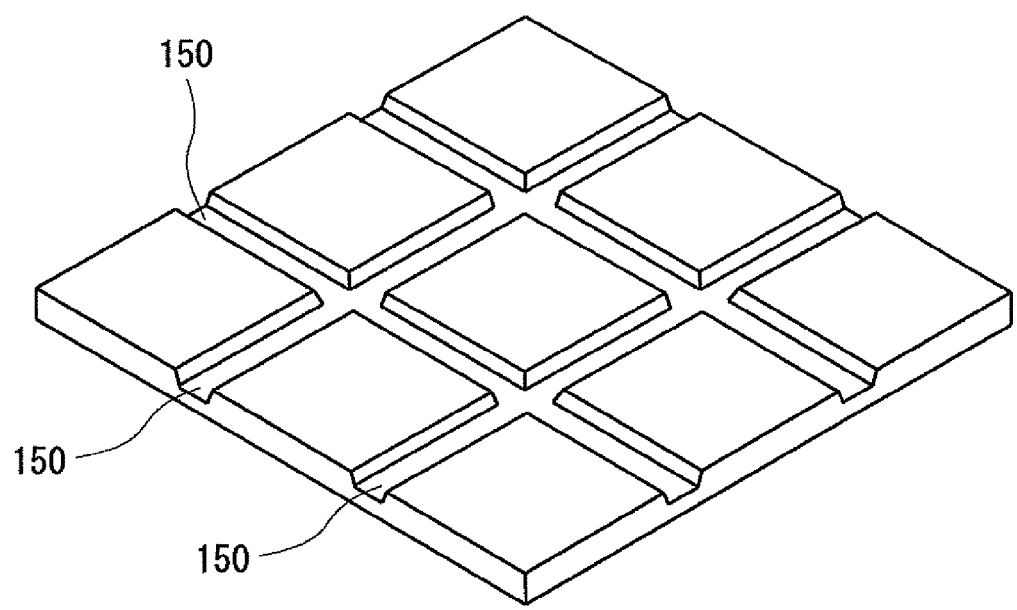
FIG. 25 is a view showing a variation of providing a groove.

In the above-described first and second embodiments, the grooves 150 are formed one by one at regular intervals as shown in FIG. 25.

Figure 26:
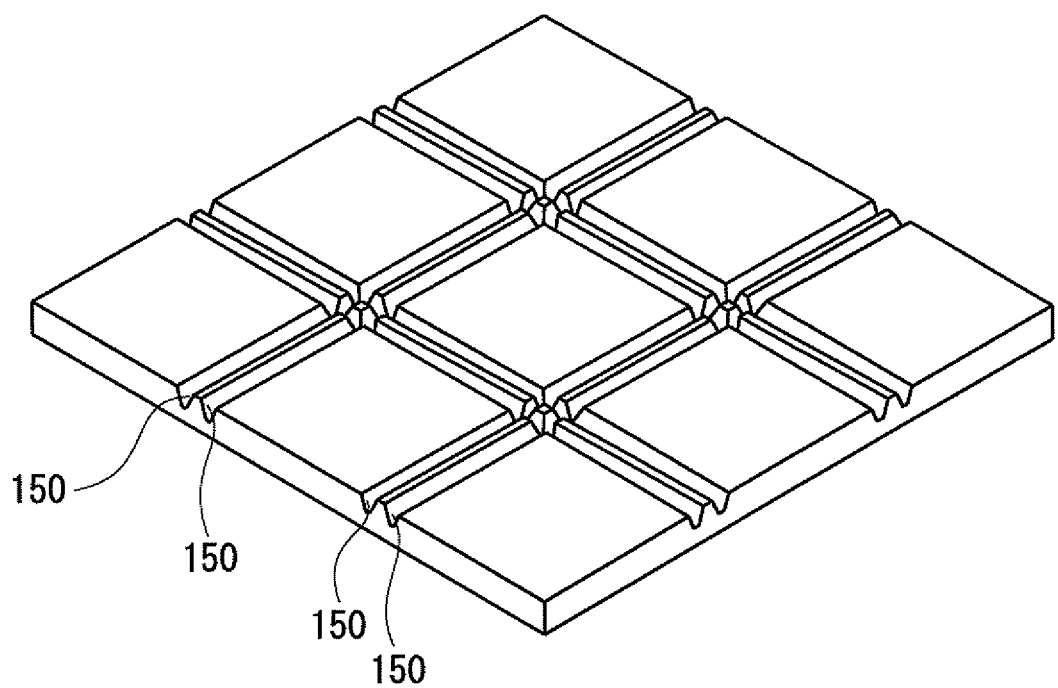
FIG. 26 is a view showing a variation of providing a groove.

It is possible to form a necessary number of grooves 150 at necessary positions according to the need to lead the line to the backside. For example, the grooves 150 may be provided at narrow intervals as shown in FIG. 26.

Use of the grooves provided at narrow intervals is described hereinafter.

The pressure sensor (MEMS sensor) 112 is manufactured eventually by cutting the wafer between the groove 150 and the groove 150. In the pressure sensor 112, the line can be lead to the backside at a plurality of positions Manufacturing steps are described sequentially from FIG. 27.

Figure 27:
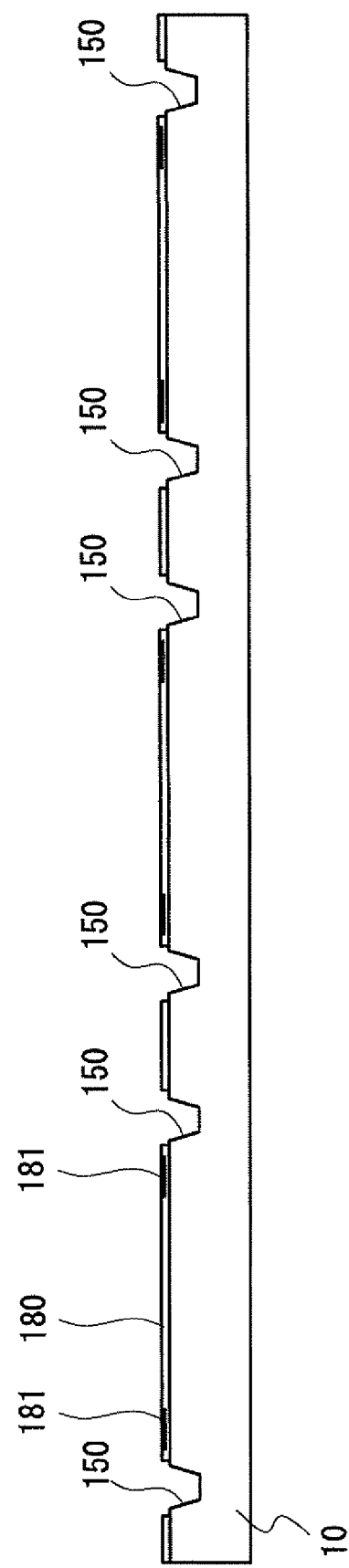
FIG. 27 is a view to provide an explanation of a third embodiment.

As shown in FIG. 27, the grooves 150 are cut into the surface of the wager 10. In this example, a functional element such as LSI is formed on the surface of the wafer 10, and a multilayered wiring layer 180 is formed thereon. A contact pad 181 for the functional element (such as LSI) is provided on the multilayered wiring layer 180. In some cases, there is a possibility that peeling or chipping of the multilayered wiring layer 180 occurs when forming the groove 150 with a rotating blade.

In this case, before forming the groove 150, the multilayered wiring layer 180 in the area to form the groove 150 is removed in advance (see FIG. 27).

Figure 28:
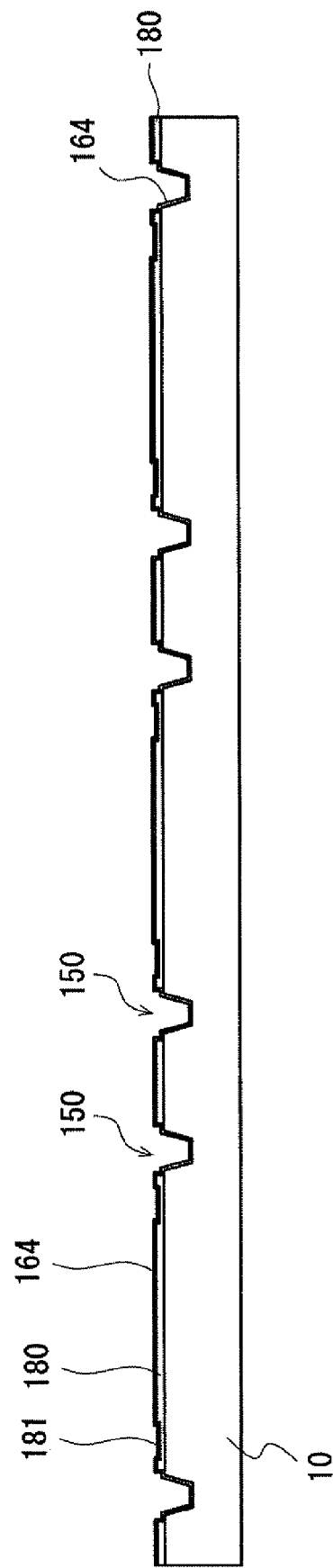
FIG. 28 is a view to provide an explanation of the third embodiment.

Then, as shown in FIG. 28, after cleaning the groove 150, $SiO_2$ is deposited with a thickness of 1 mm as the insulating film 164. Then, a resist mark is applied by a spin coater and $SiO_2$ on the pad is removed.

For example, $SiO_2$ is removed using $CHF_3$+Ar.

Figure 29:
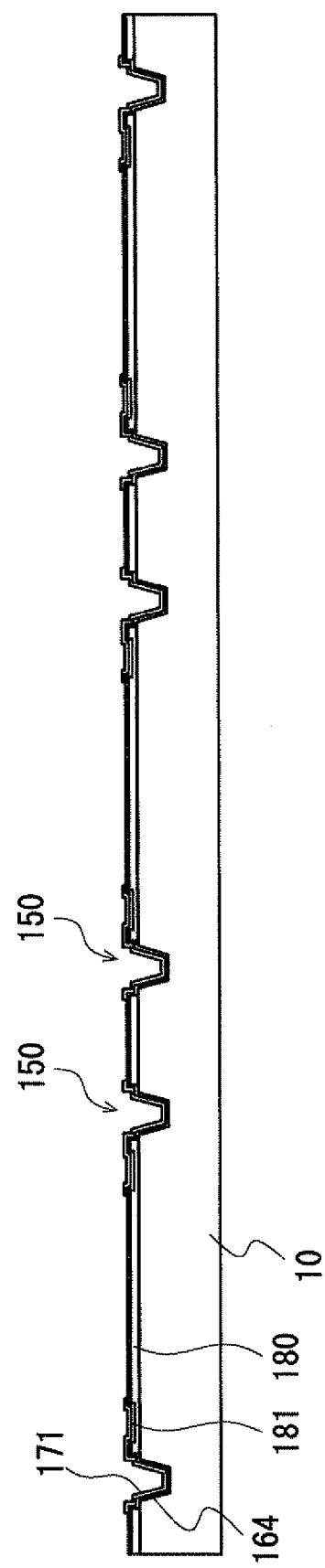
FIG. 29 is a view to provide an explanation of the third embodiment.

Then, as shown in FIG. 29, the metal line 171 that extends inside the groove 150 is formed. In this step, Ti is sputtered as a bonding layer with the insulating film ($SiO_2$) 164 and Au is plated thereon.

Figure 30:
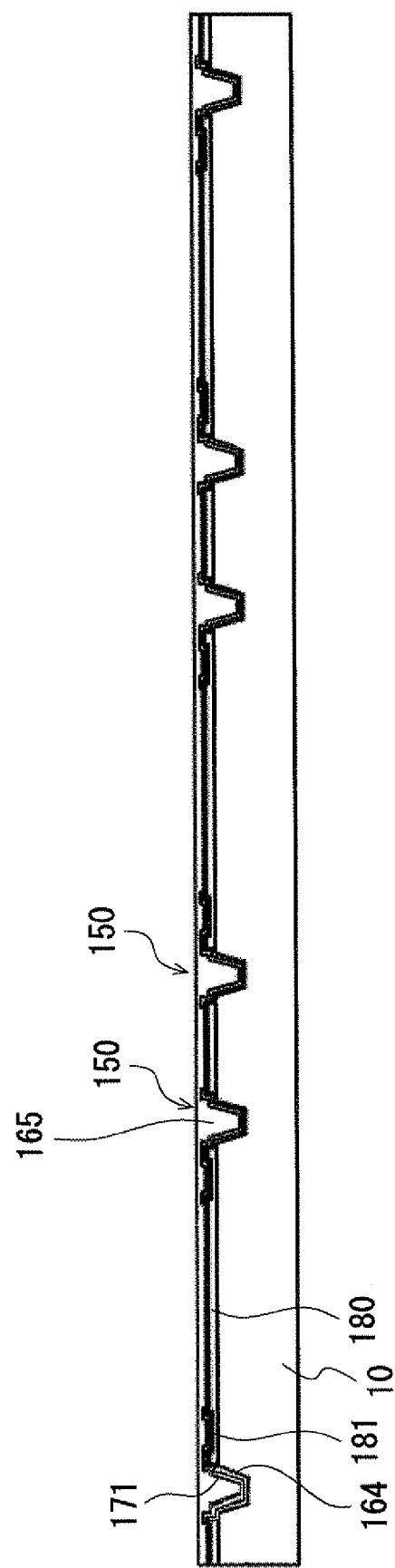
FIG. 30 is a view to provide an explanation of the third embodiment.

Then, as shown in FIG. 30, BCB (Benzocyclobutene) is applied as a mold material 165 onto the surface of the wafer 10, including the groove 150 area. The groove 150 is thereby filled with the mold material 165. Further, BCB is partially polymerized by partial curing. After that, mechanical polishing is performed to planarize the surface.

Figure 31:
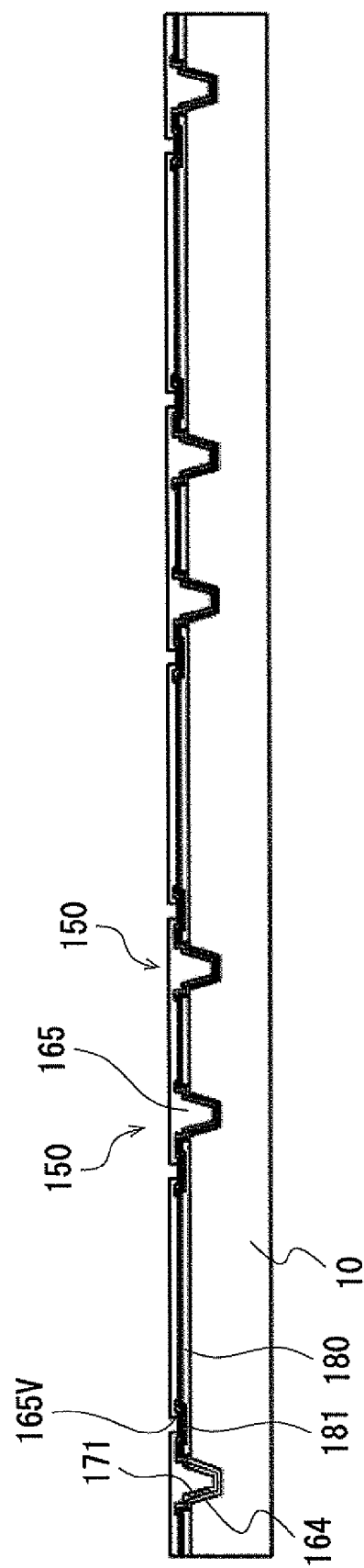
FIG. 31 is a view to provide an explanation of the third embodiment.

Then, as shown in FIG. 31, a via hole 165V is made in the mold material 165 to expose the pad 181. Resist is used for patterning of the mold material (BCB) 165. Because the surface of the mold material 165 has been planarized by mechanical polishing, such patterning by photolithography can be done.

Figure 32:
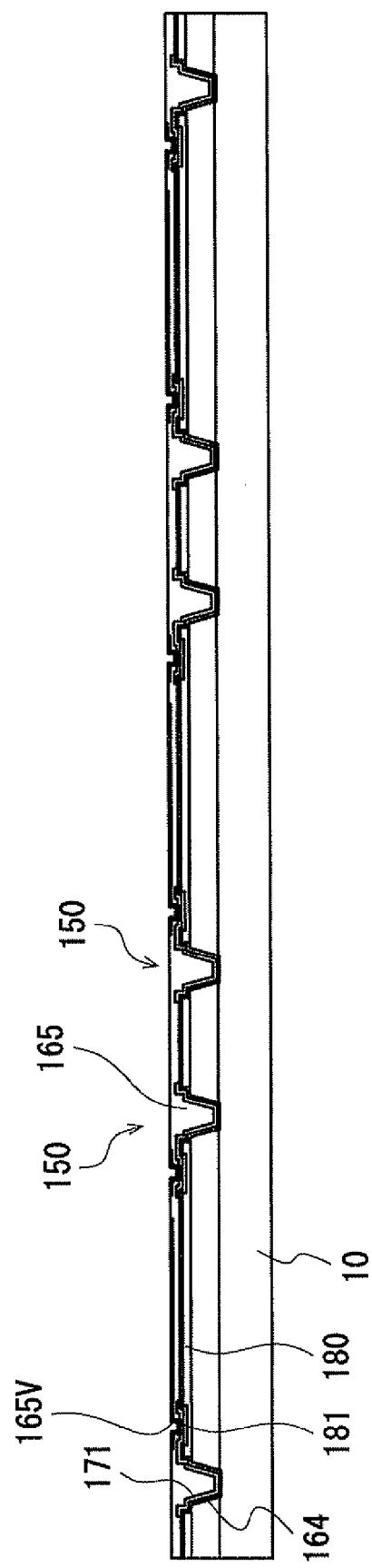
FIG. 32 is a view to provide an explanation of the third embodiment.

After that, as shown in FIG. 32, an electrode 113 is formed on the mold material 165. The electrode 113 is Al (aluminum), for example.

Figure 33:
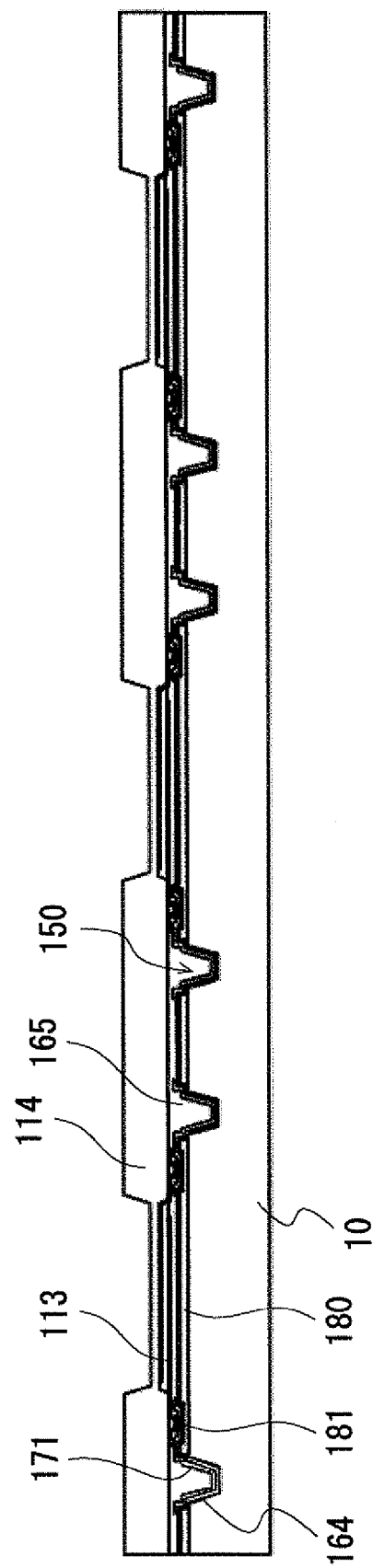
FIG. 33 is a view to provide an explanation of the third embodiment.

Then, as shown in FIG. 33, a diaphragm unit 114, which is the upper structure of the MEMS pressure sensor 112, is attached onto the top surface of the wafer 10. The partially polymerized and planarized mold material (BCB) 165 serves as a bonding layer.

Figure 34:
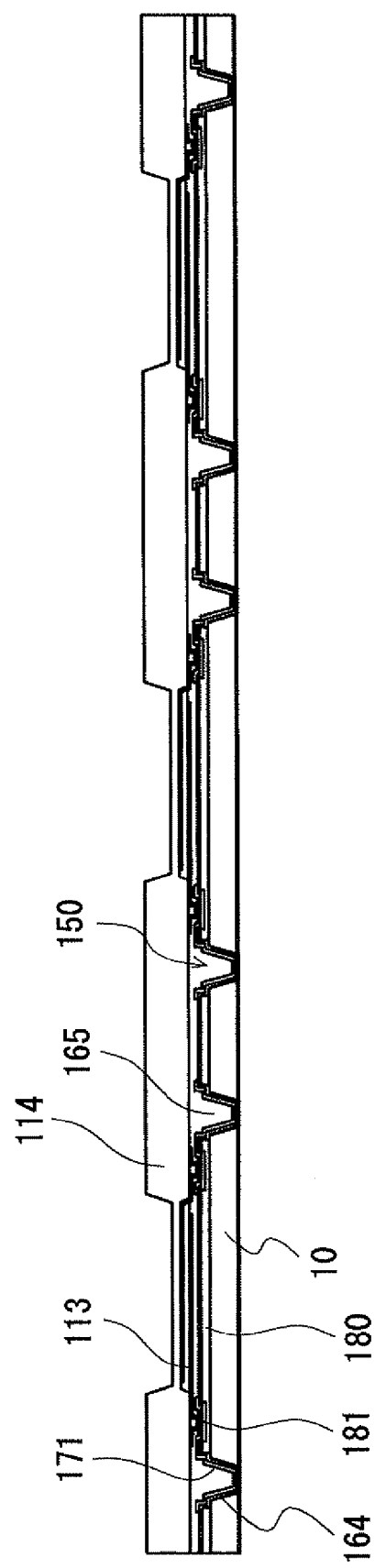
FIG. 34 is a view to provide an explanation of the third embodiment.

Then, as shown in FIG. 34, the back surface of the wafer 10 is polished using the diaphragm unit 114 as a support substrate, and thereby the wafer 10 is thinned.

Figure 35:
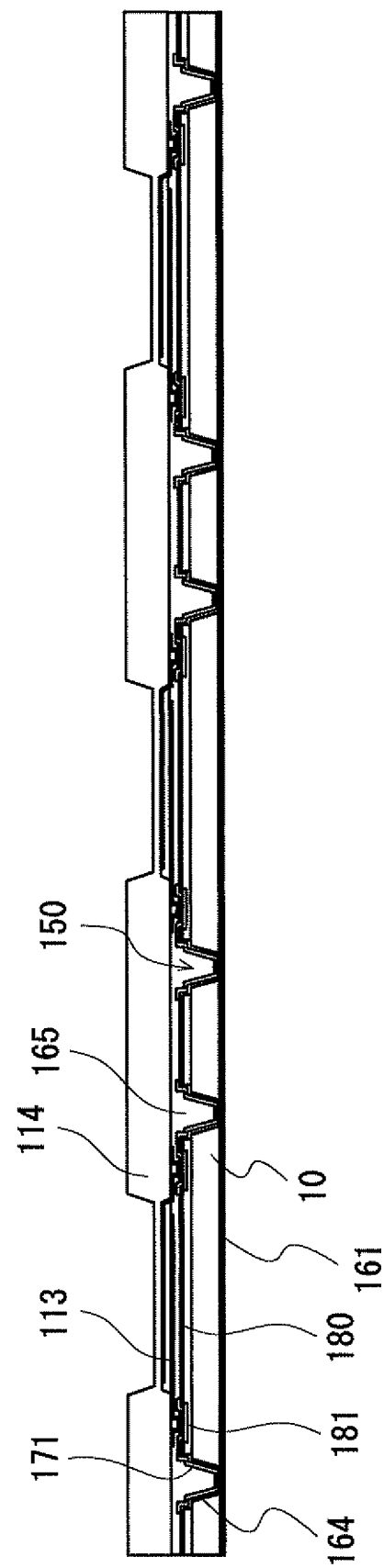
FIG. 35 is a view to provide an explanation of the third embodiment.

Then, as shown in FIG. 35, an insulating film 161 is formed on the back surface. The insulating film 161 is a BCB or TEOS film, for example.

Figure 36:
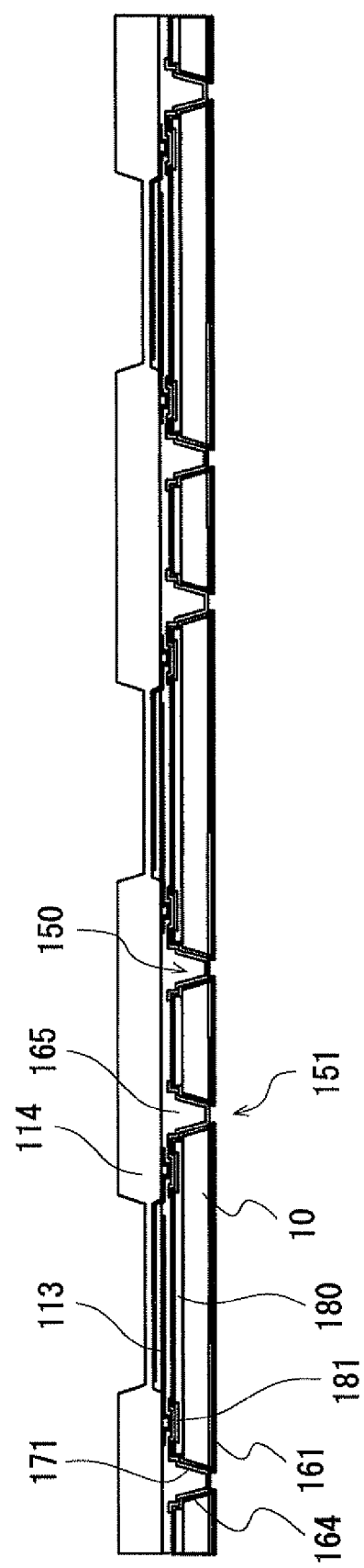
FIG. 36 is a view to provide an explanation of the third embodiment.

Then, as shown in FIG. 36, the insulating films 164 and 161 on the bottom surface 151 of the groove 150 are partially removed on the back surface. The metal line 171 is thereby exposed to the backside from the bottom surface 151 of the groove 150

Figure 37:
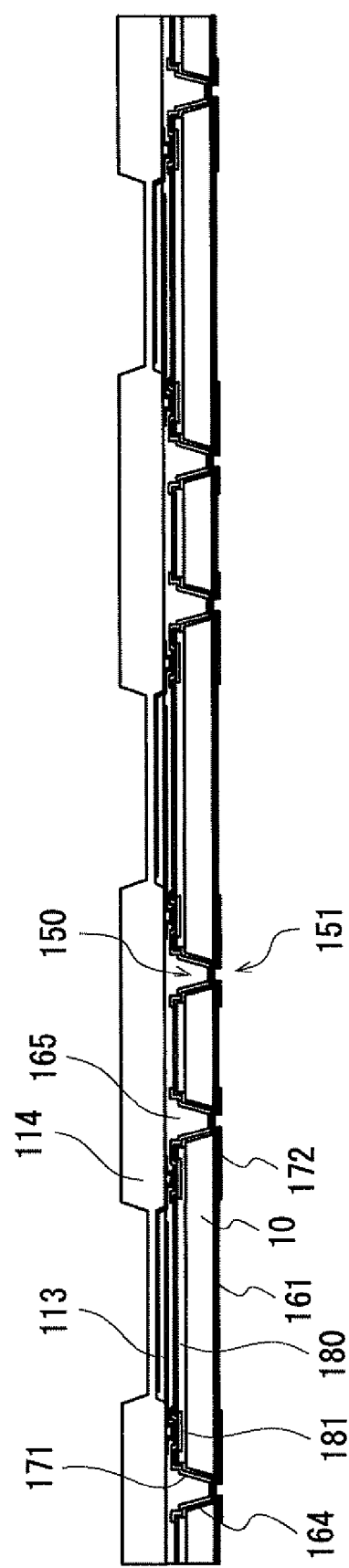
FIG. 37 is a view to provide an explanation of the third embodiment.

Then, as shown in FIG. 37, a metal line 172 is formed on the back surface. The metal line 172 can be formed using Ti and Au in the same manner as described above. This enables the line 171 to be lead to the backside.

Figure 38:
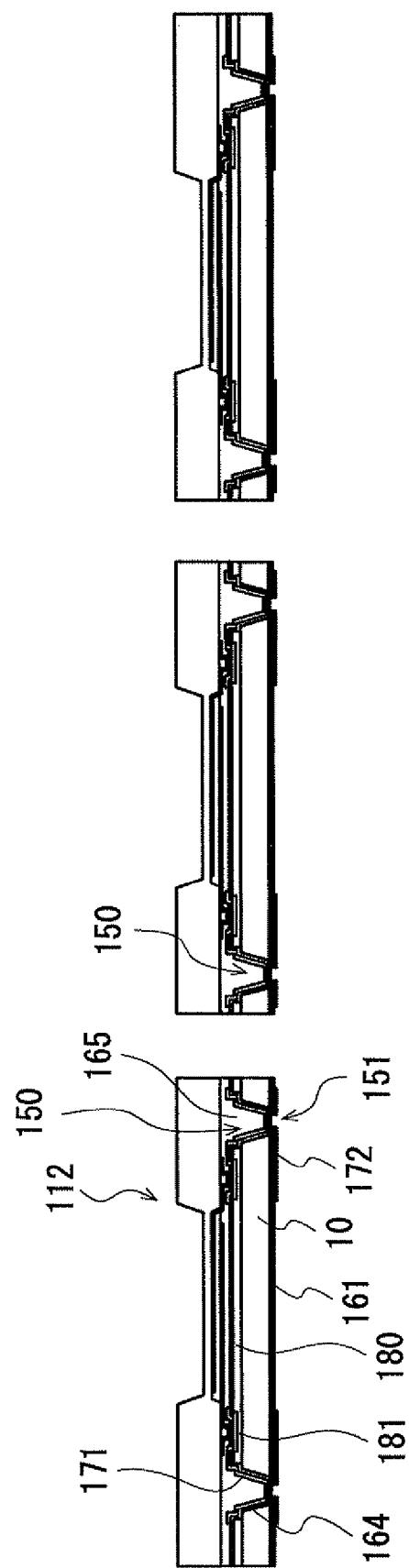
FIG. 38 is a view to provide an explanation of the third embodiment.

Finally, as shown in FIG. 38, the element (the pressure sensor 112) is separated. As described above, the wafer is cut between the groove 150 and the groove 150. Then, the pressure sensor (MEMS sensor) 112 where the line 171 can be lead to the backside is obtained.

The third embodiment has the following advantages.

(11) By appropriately designing the positions and intervals of grooves, a desired number of electrodes lead to the backside can be provided at desires positions.

(Fourth Embodiment)

In the above-described embodiments, the wafer is thinned by polishing the back surface of the wafer. As a fourth embodiment, an example of using attaching and releasing a support film, rather than polishing the back surface, is described.

Figure 39:
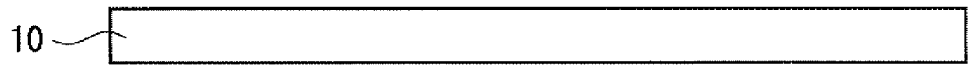
FIG. 39 is a view to provide an explanation of a fourth embodiment.
Figure 40:
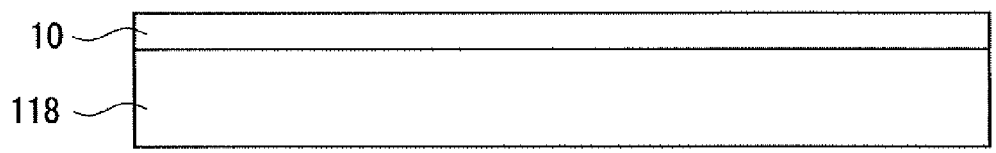
FIG. 40 is a view to provide an explanation of the fourth embodiment.

First, as shown in FIG. 39, a semiconductor substrate 10 is prepared, and necessary circuits and the like are built. Then, as shown in FIG. 40, a support film 118 is attached onto the back surface of the substrate 10. The support film 118 is a re-separable one, such as a thermally separable sheet, for example.

Figure 41:
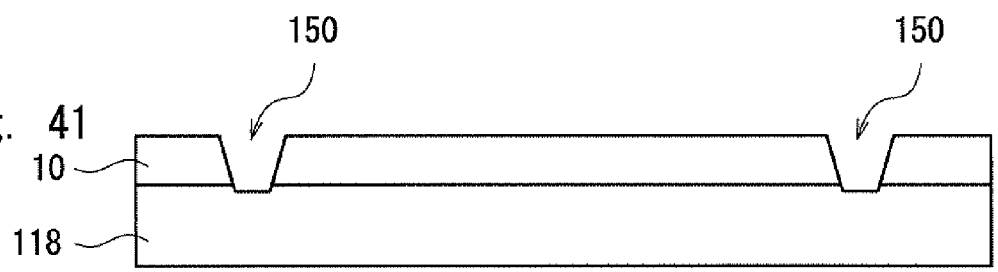
FIG. 41 is a view to provide an explanation of the fourth embodiment.

Then, as shown in FIG. 41, the groove 150 is formed from the surface of the substrate 10. The groove 150 has a depth that penetrates the substrate 10. Although the groove 150 cuts also into the support film 118 in FIG. 41, obviously, it does not matter if the support film 118 is cut or not. However, the support film 118 should not be cut so deeply to be separated.

Figure 42:
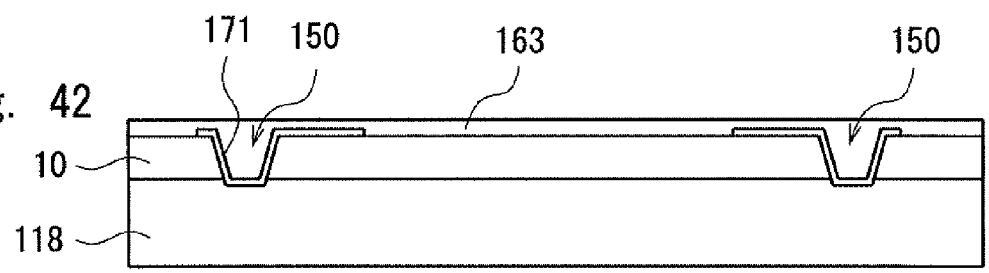
FIG. 42 is a view to provide an explanation of the fourth embodiment.

After that, as shown in FIG. 42, an electrical line 171 that extends inside the groove 150 is formed. Further, BCB (Benzocyclobutene) as a mold material 163 is applied onto the surface of the substrate 10, including the groove 150 area.

Figure 43:
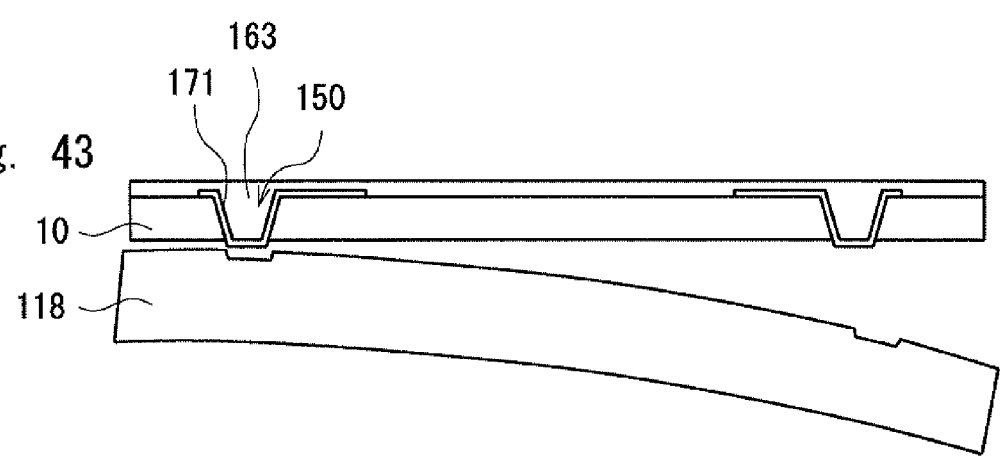
FIG. 43 is a view to provide an explanation of the fourth embodiment.

Finally, as shown in FIG. 43, the support film 118 is released. The electrical line 171 is thereby lead to the backside from the bottom surface of the groove 150.

The fourth embodiment has the following advantages.

(12) Processing is easy because there is no need to polish the back surface.

(Fifth Embodiment)

In the above-described embodiments, the semiconductor substrate is used.

On the other hand, as a fifth embodiment, a flexible substrate may be used, for example.

In addition to a flexible substrate and a flexible line, elastic resin is used as a mold material. Then, the flexible substrate where the line can be lead to the backside is obtained. Particularly, in the case of the manufacturing method that does not polish the back surface as like as the forth embodiment, the present invention can be applied with the flexible substrate as well.

Figure 44:
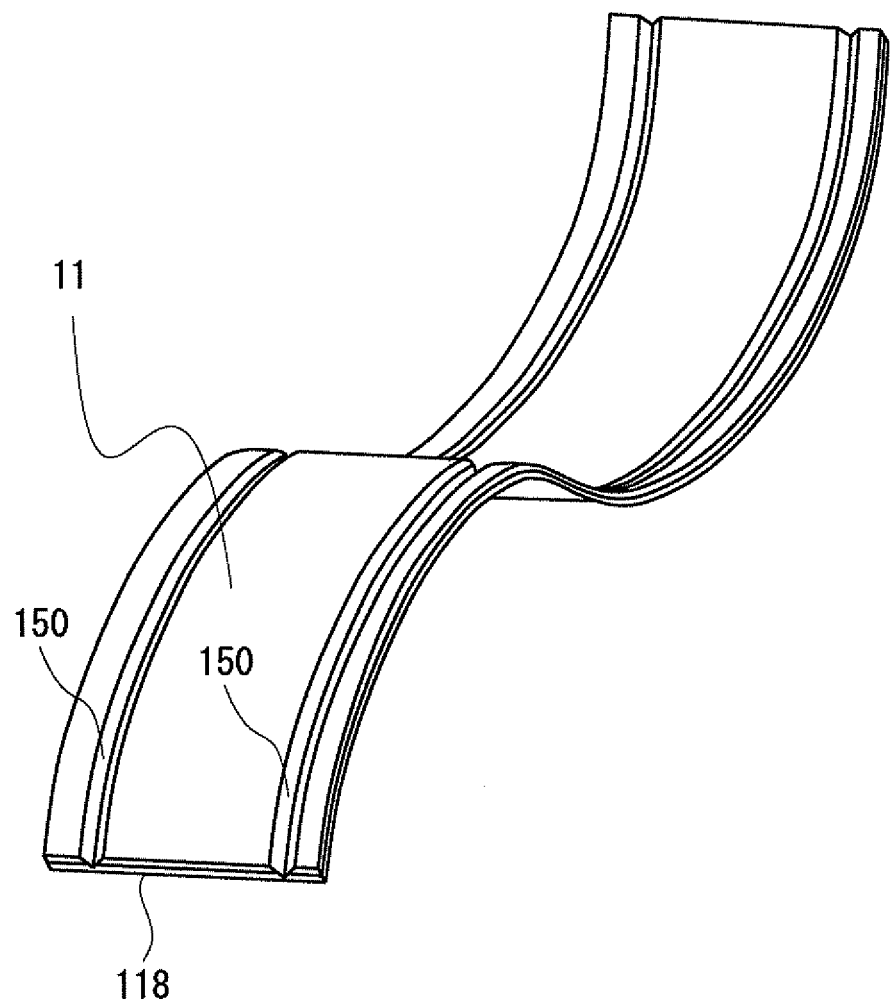
FIG. 44 is a view to provide an explanation of a fifth embodiment.
Figure 45:
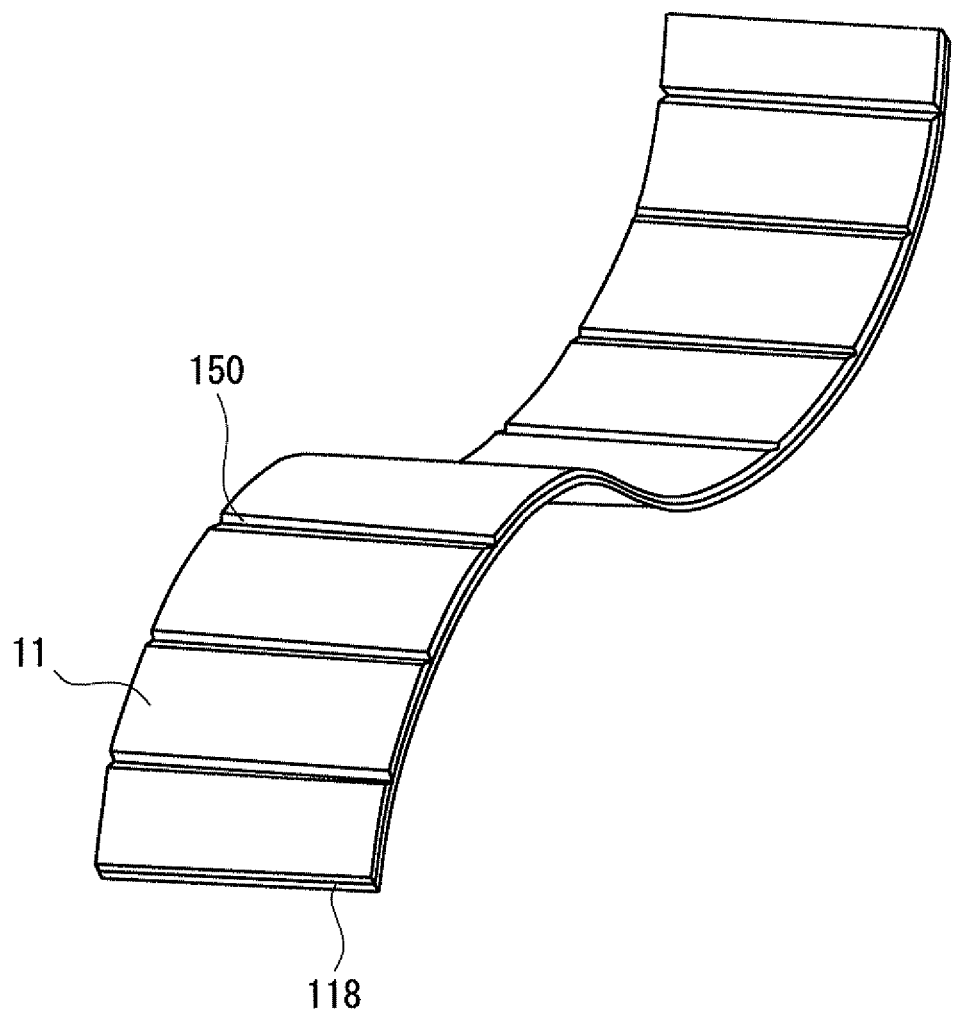
FIG. 45 is a view to provide an explanation of the fifth embodiment.

FIGS. 44 and 45 show a flexible substrate 11 where the support film 118 is attached and the groove 150 is formed.

FIG. 44 is an example of forming the groove 150 along the longitudinal direction, and FIG. 45 is an example of forming the groove 150 along the short direction.

It is preferred to design the direction and shape of the groove 150 in consideration of the structure that includes the metal line placed inside the groove 150, a tolerance or the like to a specific flexion mode.

(Sixth Embodiment)

Figure 46:
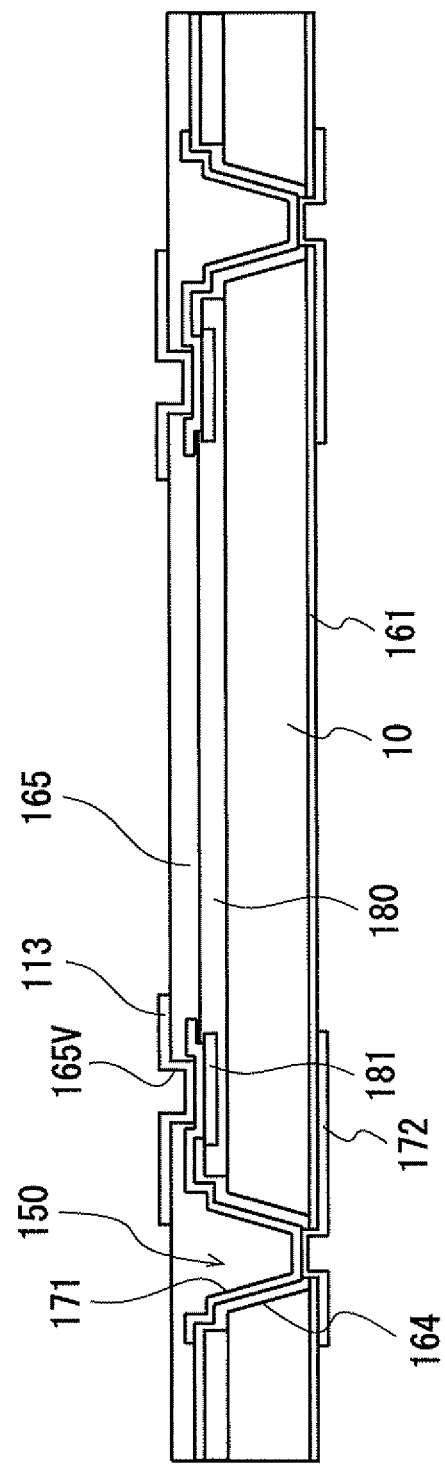
FIG. 46 is a view to provide an explanation of a sixth embodiment.
Figure 47:
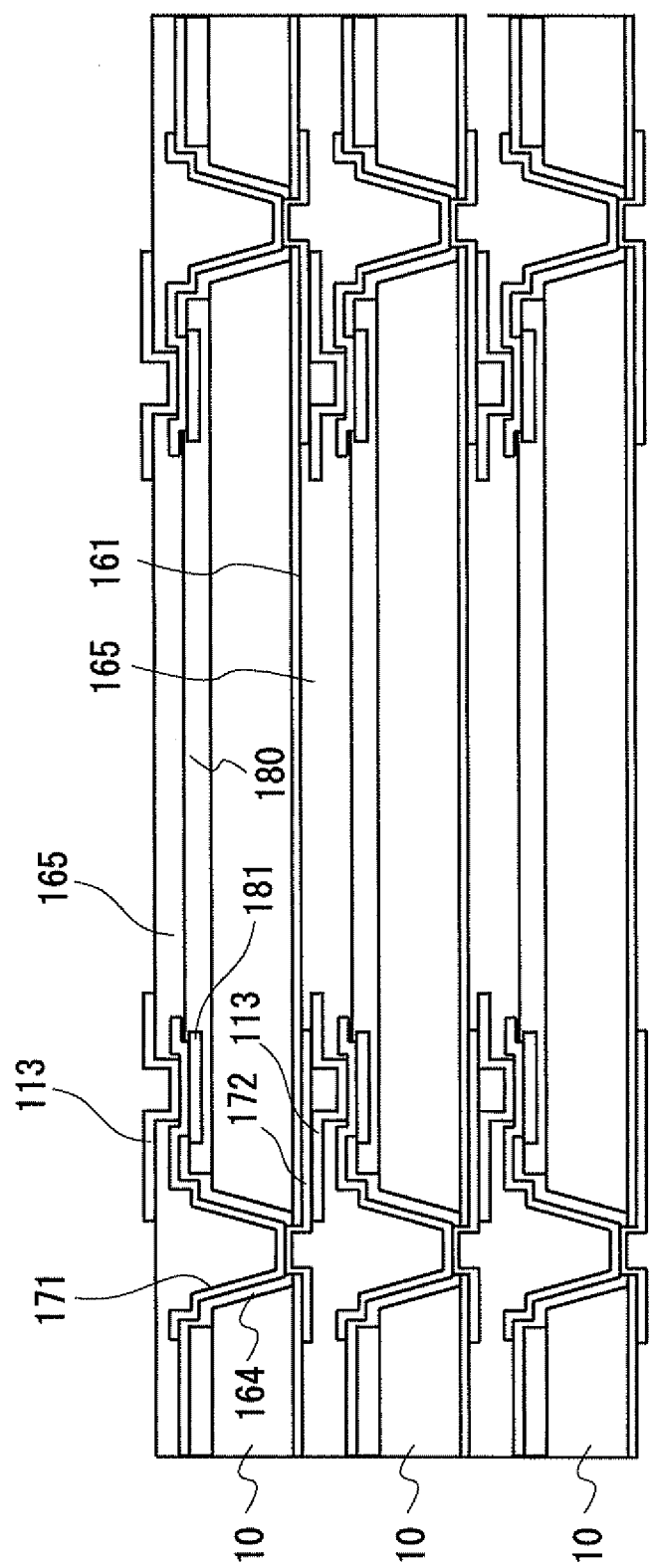
FIG. 47 is a view to provide an explanation of the sixth embodiment.

As described above, because the line can be lead to the backside, an electrical connection can be established between the upper substrate and the lower substrate simply by stacking the integrated devices. Specifically, a single-layer integrated device shown in FIG. 46 is placed on top of another one as shown in FIG. 47. The mold material 165 serves also as a bonding layer that bonds the upper and lower devices together.

A three-dimensional packaging can be easily achieved in this manner.

(Seventh Embodiment)

In the above-described embodiments, the groove is formed with a rotating blade.

As a modified example 3, several variations of the shape of the groove are shown.

Figure 48:
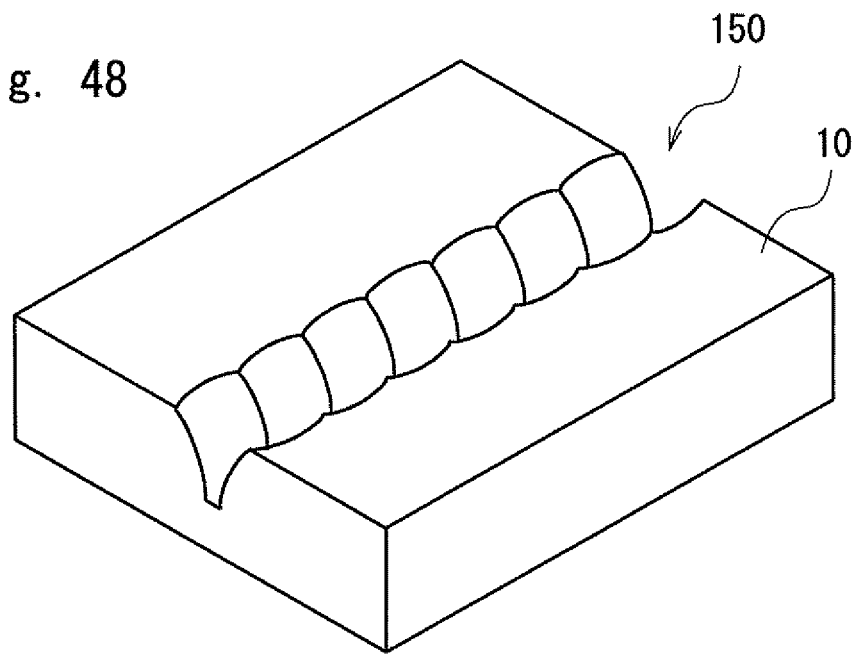
FIG. 48 is a view to provide an explanation of a seventh embodiment.

FIG. 48 shows an example in which the groove is formed by laser machining. Inside the groove, laser machining marks are left along the groove depth direction.

Figure 49:
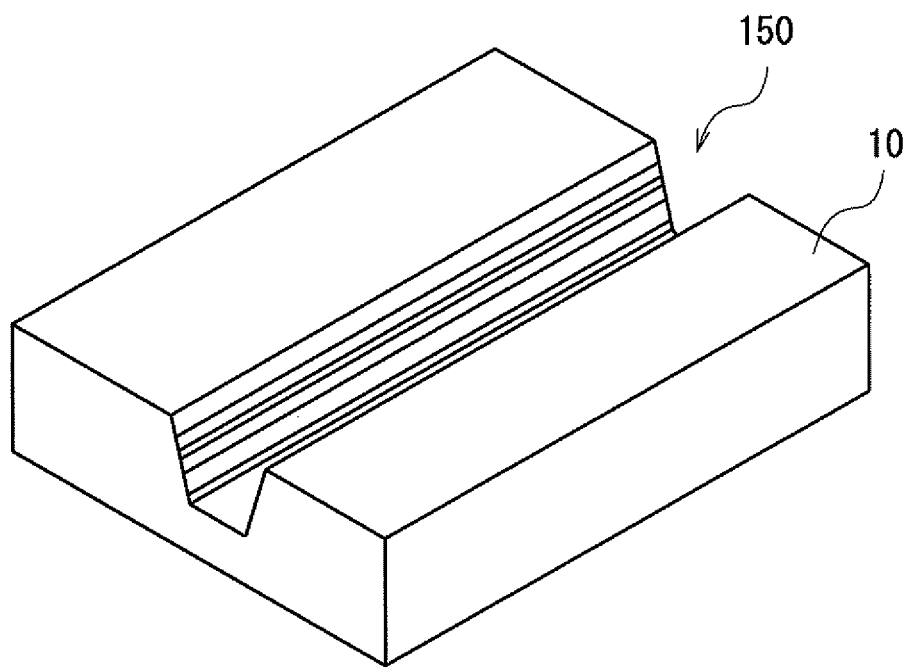
FIG. 49 is a view to provide an explanation of the seventh embodiment.

FIG. 49 shows an example in which the groove is formed by a V-shaped blade. Inside the groove, machining marks are left along the blade moving direction.

Figure 50:
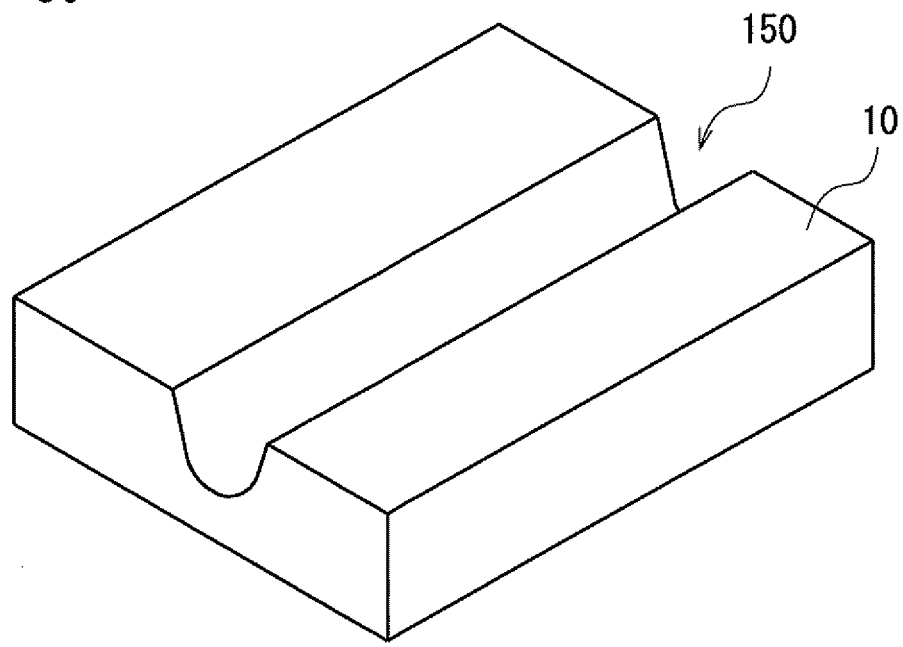
FIG. 50 is a view to provide an explanation of the seventh embodiment.

FIG. 50 shows an example in which the groove is formed by sandblasting. The surface inside the groove is roughened, and machining marks are left. An average roughness of the machining marks is about ten microns, for example.

If the groove is formed by machine processing, micro or macro roughness are left on the surface inside the groove. With use of such roughness, the base substrate and the resin or metal placed thereon can be adhered closely, which solves the problem of affinity.

(Eighth Embodiment)

In the above-described embodiments, when providing the electrical line 171 for establishing an electrical conduction between the device regions, the line member 171 is placed to extend inside the groove. Specifically, the metal line 171 is provided to lie along the inclined surface 152 and the bottom surface 151 of the groove 150. As the line between the device regions, a line 173 may be placed to lie across the groove 150 after filling the groove 150 with a mold material 163 as shown in FIG. 51.

Figure 51:
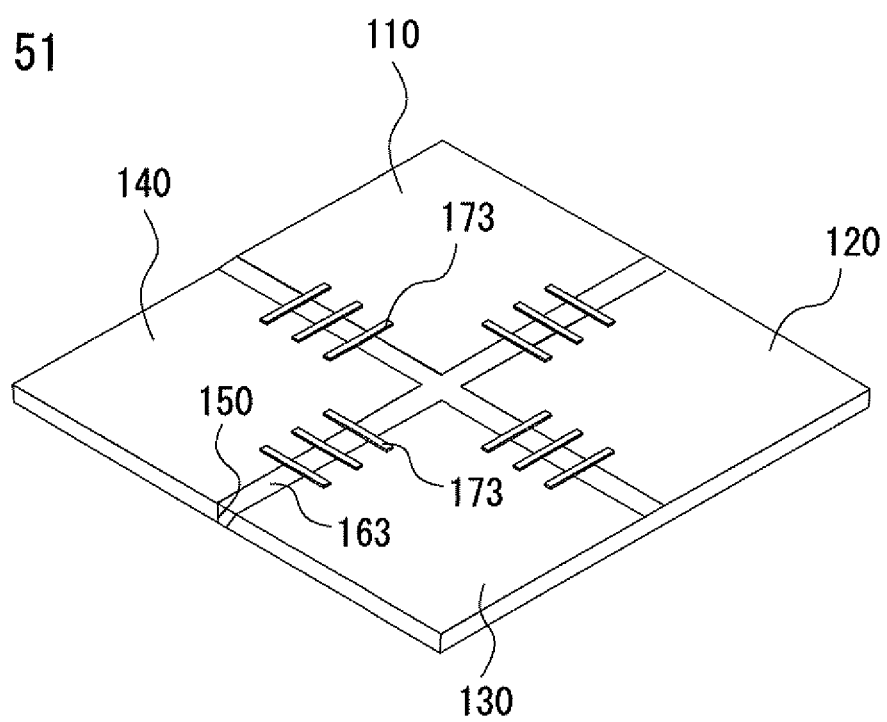
FIG. 51 is a view to provide an explanation of an eighth embodiment.

In FIG. 51, after filling the groove 150 with the mold material 163, the mold material 163 is mechanically polished to be planarized. Then, the line 173 that electrically connects the adjacent device regions is formed extending onto the planarized mold material 163.

In this structure also, the device regions are separated from each other and joined by the mold material at the same time, thus achieving the integrated device with high insulation tolerance.

The present invention is not limited to the embodiments described above, and various changes and modifications may be made without departing from the scope of the invention. As the substrate, rigid substrates such as a silicon semiconductor substrate or a semiconductor substrate made from another compound, or a thin metal plate, glass, ceramic, printed board and the like may be used. Further, flexible substrates such as a substrate made from resin or a thin metal plate may be used.

Although the pressure sensor is shown as one example of the functional element, it may be a sensor or an actuator as a matter of course.

The sensor may be a pressure sensor, a force sensor, a temperature sensor or the like, which is not particularly limited.

When joining the MEMS device onto the surface of the substrate, the joint layer may be a mold material such as BCB, or it may be solder, eutectic solder, intermetallic compound, low-melting metal or the like, or low rigid metal protrusions may be used to fit with each other.

This application is based upon and claims the benefit of priority from Japanese patent application No. 2012-079811, filed on Mar. 30, 2012, the disclosure of which is incorporated herein in its entirety by reference.

REFERENCE SIGNS LIST

10 . . . WAFER (SUBSTRATE), 11 . . . FLEXIBLE SUBSTRATE, 12 . . . INSULATING SUBSTRATE, 100 . . . SEMICONDUCTOR DEVICE, 110 . . . DEVICE REGION, 111 . . . SEMICONDUCTOR SUBSTRATE, 112 . . . PRESSURE SENSOR, 113 . . . LOWER ELECTRODE, 114 . . . DIAPHRAGM UNIT, 115 . . . ELECTRODE, 116 . . . BONDING LAYER, 117 . . . SUPPORT SUBSTRATE, 118 . . . SUPPORT FILM, 120 . . . SEMICONDUCTOR DEVICE REGION, 121 . . . SEMICONDUCTOR SUBSTRATE, 123 . . . OPENING, 130 . . . SEMICONDUCTOR DEVICE REGION, 131 . . . SEMICONDUCTOR SUBSTRATE, 140 . . . SEMICONDUCTOR DEVICE REGION, 141 . . . SEMICONDUCTOR SUBSTRATE, 150 . . . GROOVE, 151 . . . BOTTOM SURFACE, 152 . . . SIDE SURFACE, 153 . . . OPENING, 160 . . . MOLD MATERIAL (INSULATING FILM), 161 . . . INSULATING FILM, 162 . . . SEMICONDUCTOR LAYER, 163 . . . MOLD MATERIAL, 164 . . . INSULATING FILM, 165 . . . MOLD MATERIAL, 165V . . . VIA HOLE, 171 . . . LINE MEMBER, 172 . . . BACKSIDE LINE, 173 . . . LINE, 180 . . . MULTILAYERED WIRING LAYER, 181 . . . CONTACT PAD

The invention claimed is:

1. An integrated device made up of a plurality of different types of devices separated from one another and mechanically joined together, wherein each device comprises a functional element mounted onto a substrate, a groove having a side surface containing an inclined surface is formed between adjacent substrates, when a front surface is in a side of the integrated device where the functional element is mounted, the inclined surface makes the groove to become narrower along the direction from the front surface to a back surface of the integrated device, an insulating material is disposed at the groove, and adapted so that the plurality of substrates are mechanically joined together, while the devices are electrically insulated from one another.

2. The integrated device according to claim 1, wherein the insulating material disposed at the groove is a mold material.

3. The integrated device according to claim 1, wherein the insulating material forms a bottom surface of the groove.

4. The integrated device according to claim 1, wherein the insulating material forms the side surface and the bottom surface of the groove.

5. The integrated device according to claim 1, wherein the groove is filled with the insulating material.

6. The integrated device according to claim 1, wherein the insulating material is formed to continuously cover surfaces of the plurality of devices and inside of the groove.

7. The integrated device according to claim 1, wherein the insulating material is made from as same ingredient as an insulating film formed on a surface of the device and continuous with the insulating film.

8. The integrated device according to claim 1, wherein a line member is located to extends inside the groove to establish an electrical conduction between the adjacent devices, and the line member is formed besides the side surface of the groove and the bottom surface of the groove.

9. The integrated device according to claim 8, wherein an insulating film is interposed between the line member and the device adapted to electrically insulate the line member and the device from each other.

10. The integrated device according to claim 8, wherein a hole is formed at the bottom surface of the groove, and the line member is exposed toward the back surface through the hole.

11. The integrated device according to claim 8, wherein the groove is filled with the insulating material, and the line member is protected by the insulating material filled inside the groove.

12. The integrated device according to claim 5, wherein a surface of the insulating material filled inside the groove is planarized, and a line for establishing an electrical conduction between the adjacent devices is formed across the groove on the planarized surface.

13. The integrated device according to claim 1, wherein the functional element is an electronic circuit or a MEMS device.

14. The integrated device according to claim 13, wherein the functional element is a high power drive device.

15. The integrated device according to claim 1, wherein the device is formed on any one of a silicon semiconductor substrate, a compound semiconductor substrate, a thin metal plate substrate, a glass substrate, a ceramic substrate, a printed substrate and a resin substrate.

16. A manufacturing method for manufacturing an integrated device according to claim 1, comprising:

a step of forming a groove having a side surface containing an inclined surface from a surface of the substrate wherein a depth of the groove does not penetrate the substrate;

a step of burying at least a bottom surface of the groove under an insulating material; and a step of polishing a back surface of the substrate for thinning to separate adjacent devices from one another.

17. A manufacturing method for manufacturing an integrated device according to claim 1, comprising:

a step of attaching a support film onto a back surface of a substrate;

a step of forming a groove from a front surface of the substrate wherein the groove has a depth that the groove penetrates the substrate but does not penetrate the support film;

a step of burying at least a bottom surface of the groove under an insulating material; and a step of separating the support film.

18. The manufacturing method for the integrated device according to claim 16, wherein
the insulating material is a mold material.

* * * * *